(12) United States Patent  
Dunga et al.

(10) Patent No.: US 9,368,222 B2
(45) Date of Patent: Jun. 14, 2016

(54) BIT LINE PRE-CHARGE WITH CURRENT REDUCTION

(71) Applicant: SanDisk Technologies Inc., Plano, TX (US)

(72) Inventors: Mohan Vamsi Dunga, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/503,987

(22) Filed: Oct. 1, 2014

(65) Prior Publication Data

US 2016/0099066 A1   Apr. 7, 2016

(51) Int. Cl.
*G11C 16/04* (2006.01)
*G11C 16/24* (2006.01)
*G11C 16/10* (2006.01)

(52) U.S. Cl.
CPC ............ *G11C 16/24* (2013.01); *G11C 16/0483* (2013.01); *G11C 16/10* (2013.01)

(58) Field of Classification Search
CPC .......................... G11C 16/0483; H01L 27/115
USPC .............. 365/185.17, 185.02, 185.28, 185.18
IPC .............................. G11C 16/0483; H01L 27/115
See application file for complete search history.

(56) References Cited

U.S. PATENT DOCUMENTS

| 6,975,537 | B2 | 12/2005 | Lutze et al. | |
|---|---|---|---|---|
| 7,463,531 | B2 * | 12/2008 | Hemink | G11C 11/5628 365/185.17 |
| 7,656,703 | B2 * | 2/2010 | Dong | G11C 16/0483 365/185.02 |
| 8,537,617 | B2 | 9/2013 | Kim et al. | |
| 8,854,890 | B1 * | 10/2014 | Miwa | G11C 16/0483 365/185.02 |
| 8,988,945 | B1 * | 3/2015 | Miwa | G11C 16/0483 365/185.02 |
| 2013/0250687 | A1 | 9/2013 | Chan | |
| 2014/0112075 | A1 * | 4/2014 | Dunga | G11C 16/12 365/185.17 |

* cited by examiner

*Primary Examiner* — Connie Yoha
(74) *Attorney, Agent, or Firm* — Vierra Magen Marcus LLP

(57) ABSTRACT

Disclosed herein are techniques for pre-charging channels when programming memory cells. A pre-charge voltage is applied to both selected bit lines and inhibited bit lines during a channel pre-charge phase. The pre-charge voltage is passed to the channels of NAND strings. The voltage on the inhibited bit lines is then reduced to a program inhibit voltage. Also, the voltage on the selected bit lines is reduced to a program enable voltage. Further, the pre-charge voltage from the channels of the selected NAND strings is discharged while maintaining the pre-charge voltage in the channels of the inhibited NAND strings. The potential in the channels of the inhibited NAND strings may then be boosted and a programming voltage may be applied to a selected word line.

23 Claims, 19 Drawing Sheets

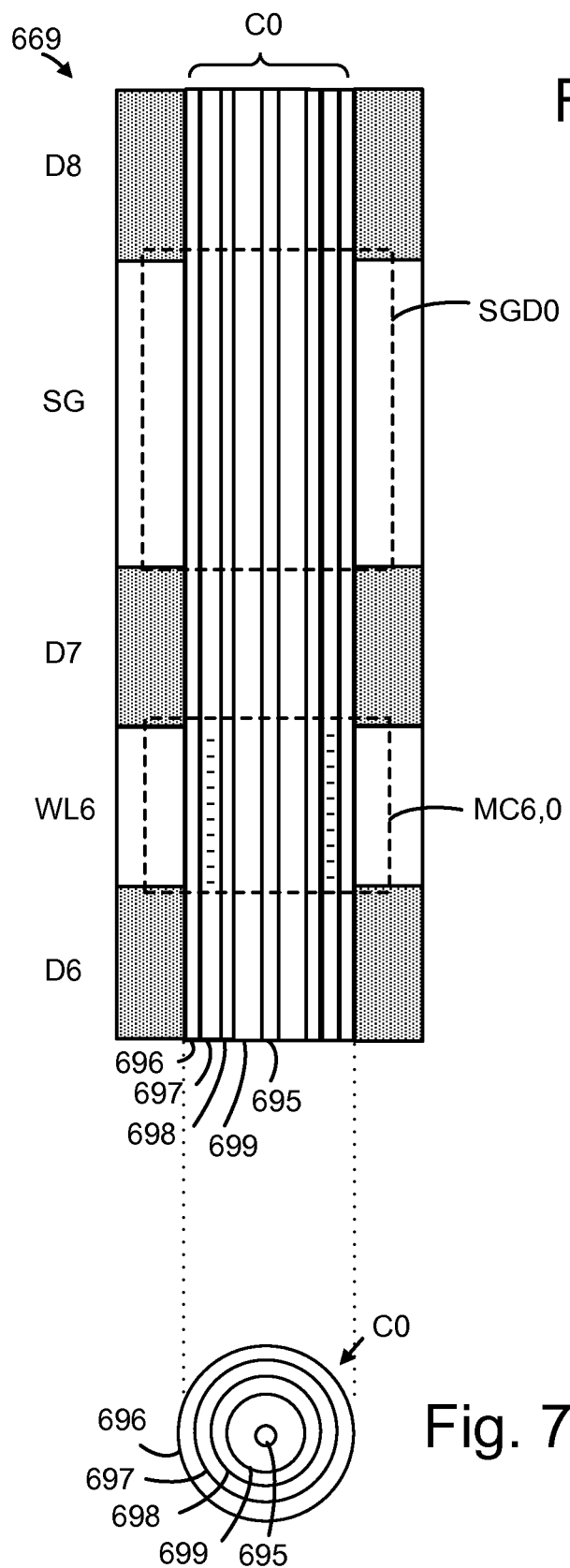

BIT LINE PRE-CHARGE WITH CURRENT REDUCTION

BACKGROUND

The present disclosure relates to technology for non-volatile storage.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some EEPROMs or flash memory devices have a configuration referred to as a NAND configuration in which memory cells are grouped as NAND strings with each NAND string associated with a bit line. One type of NAND memory array is a two-dimensional array. Another type of NAND memory array is a three-dimensional array. One 3D NAND stacked memory device is sometimes referred to as a Bit Cost Scalable (BiCS) architecture.

In a 3D NAND BiCS architecture, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

Memory cells in some NAND architectures have a charge storage region that holds charge to program the memory cells. One example of a charge storage region is a conductive floating gate. Another example of a charge storage region is a dielectric charge trapping region. When programming an EEPROM or flash memory device, such as a NAND flash memory device, typically a program voltage is applied to the control gate (or selected word line) and the bit line is grounded. Electrons from the channel are injected into the charge storage region. When electrons accumulate in the charge storage region, the charge storage region becomes negatively charged and the threshold voltage of the memory cell is raised so that the memory cell is in a programmed state.

BRIEF DESCRIPTION OF THE DRAWINGS

Like-numbered elements refer to common components in the different figures.

FIG. 7A depicts a close-up view of the region 669 of the column C0 of FIG. 5B.

FIG. 7B depicts a cross-sectional view of the column C0 of FIG. 7A.

DETAILED DESCRIPTION

Figure 1A:
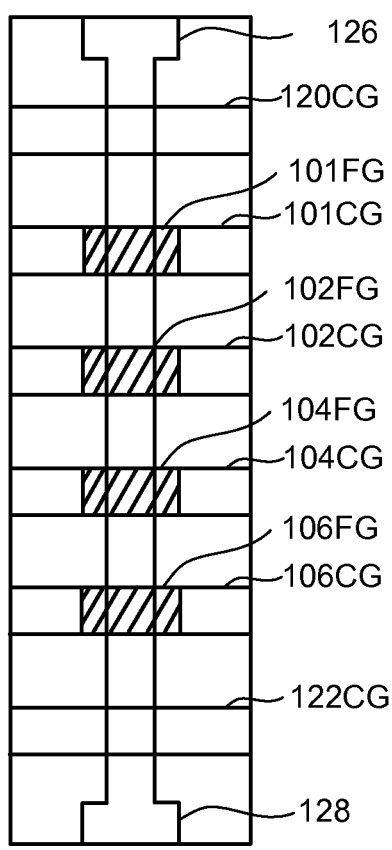
FIG. 1A is a top view of a NAND string.

In some techniques for programming non-volatile storage, the voltage of channels of strings of storage elements that are inhibited from programming are boosted to help prevent program disturb. Prior to the boosting phase, the channels may be pre-charged, which can assist the later boosting. One possible technique to pre-charge the channels is to apply a pre-charge voltage to inhibited bit lines and turn on a drain side select gate to pass the pre-charge voltage to the channel of strings that are inhibited from programming.

As will be further explained below, the charging of the bit lines during programming can draw considerable current. The current required to charge the bit lines during programming is reduced using one embodiment. This has an advantage of reducing peak current. This may alleviate the need for adding a larger charge pump to the memory device.

In one embodiment, a pre-charge voltage is applied to both selected bit lines and inhibited bit lines during a channel pre-charge phase of a programming operation. Then, a voltage may be applied to a drain side select line that turns on the drain side select gates while the pre-charge voltage is applied to the group of bit line. This pre-charges the channels of NAND strings while reducing the peak current. The voltage on the inhibited bit lines is then reduced to a program inhibit voltage. Also, the voltage on the selected bit lines is reduced to a program enable voltage. Further, the pre-charge voltage from the channels of the selected NAND strings is discharged while maintaining the pre-charge voltage in the channels of the inhibited NAND strings. The potential in the channels of the inhibited NAND strings may then be boosted and a programming voltage may be applied to a selected word line.

One example of a memory system suitable for implementing embodiments uses a NAND flash memory architecture, which includes connecting multiple transistors in series between two select gates. Note that this could be a 2D NAND architecture or a 3D NAND architecture. Some examples are described herein of a 2D NAND architecture. Other examples described herein are of a 3D NAND architecture. Programming techniques described herein can be applied to 2D NAND, 3D NAND, but are not limited thereto.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

Figure 1B:
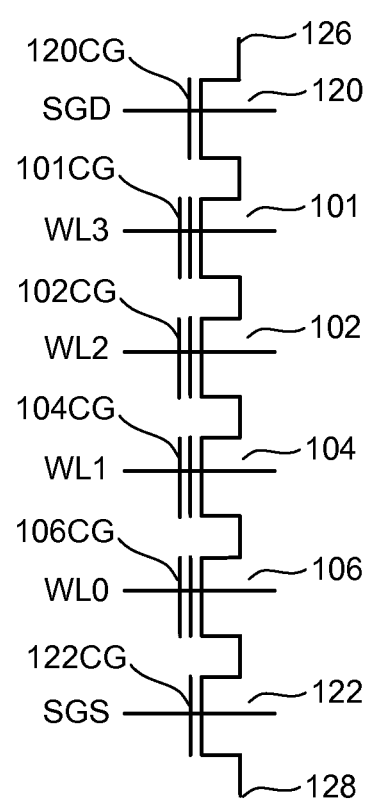
FIG. 1B is an equivalent circuit diagram of the NAND string of FIG. 1A.

The transistors connected in series and the select gates are referred to as a NAND string in one embodiment. FIG. 1A is a top view showing one NAND string. FIG. 1B is an equivalent circuit thereof. The NAND string includes four transistors, 101, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines may be shared with multiple NAND strings. For some embodiments, the bit line runs on top of the NAND strings in a direction perpendicular to the word lines and is connected to one or more sense amplifiers.

Figure 2:
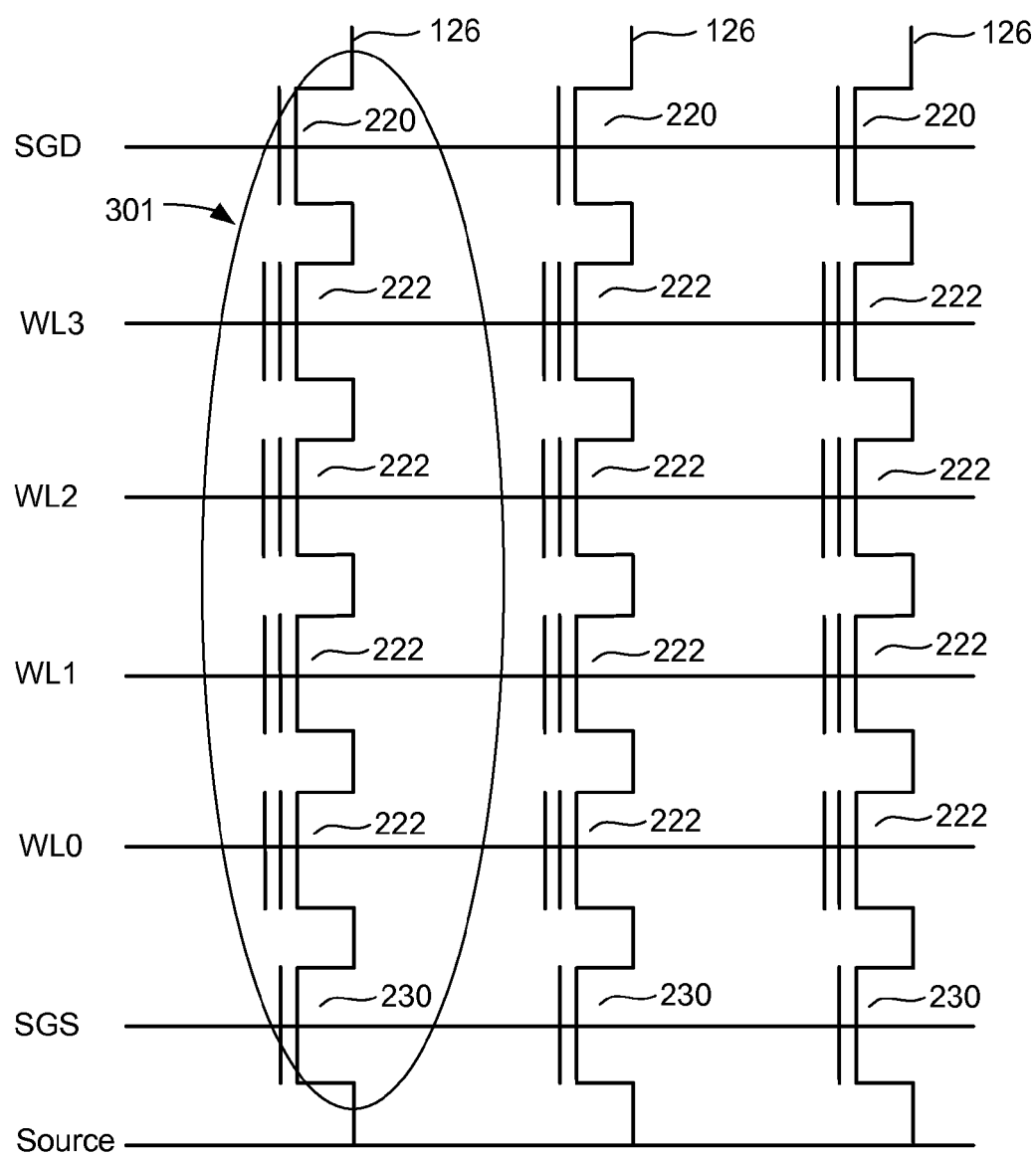
FIG. 2 is a circuit diagram of three NAND strings with associated word lines.

FIG. 2 shows three NAND strings 301 of a memory array having many more NAND strings. Each of the NAND strings of FIG. 2 includes two select transistors 220, 230 and four memory cells 222. Each NAND string is connected to the source line (Source) by its source side select transistor 230. A selection line SGS is used to control the source side select gates 230. The various NAND strings are connected to respective bit lines 126 by a drain side select transistor 220, which is controlled by select line SGD. In other embodiments, the select lines do not necessarily need to be in common. Each word line (WL0, WL1, WL2, WL3) is connected to the control gate of one memory cell 22 on each NAND string 301. As can be seen, each bit line and the respective NAND string comprises the columns of the array of memory cells. The word lines (WL3, WL2, WL1 and WL0) comprise the rows of the array.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 224 of FIG. 2, the program voltage will also be applied to the control gates of storage elements 244 and 254. The foregoing contained an example in which the charge storage region is a conductive floating gate, but another charge storage region such as a dielectric charge trapping region can be used. The charge storage region may also comprise conductive nanoparticles.

Figure 3:
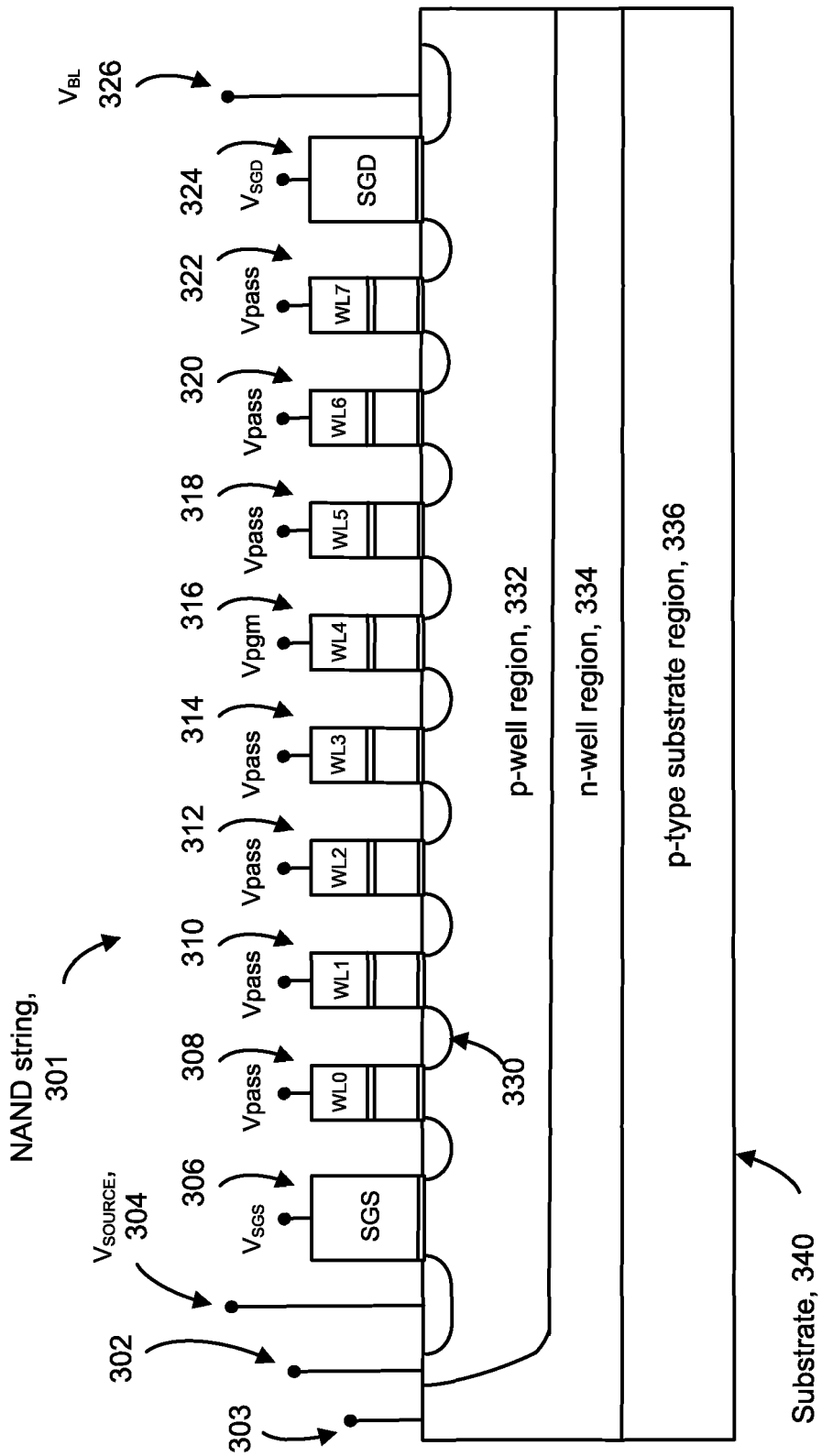
FIG. 3 depicts a cross-sectional view of a NAND string formed on a substrate.

FIG. 3 depicts a cross-sectional view of a 2D NAND string formed on a substrate. The view is simplified and not to scale. The 2D NAND string 301 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The 2D NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a program operation, a program voltage $V_{PGM}$ is provided on a selected word line, in this example, WL4, which is associated with storage element 316. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass or boosting voltage, $V_{PASS}$ is applied to the remaining unselected word lines associated with NAND string 301. $V_{SGS}$ and $V_{SGD}$ are applied to the select gates 306 and 324, respectively. Note that programming in a 3D NAND architecture has many similarities. However, the shape and orientation of the NAND string and word lines are different, as described below.

The discussion herein can also apply to other types of flash memory in addition to NAND as well as other types of non-volatile memory. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. Other types of memory devices can also be used.

The following discussion of an example 3D memory device is presented as one possible architecture in which embodiments may be practiced. These examples include a 3D NAND memory device. That is, the device includes NAND strings. These strings may be similar to those depicted in FIGS. 1A-2, although note that a floating gate is not necessarily used in a 3D memory device. As will be discussed below, memory cells have a charge trapping region in one embodiment of a 3D NAND memory device.

Figure 4:
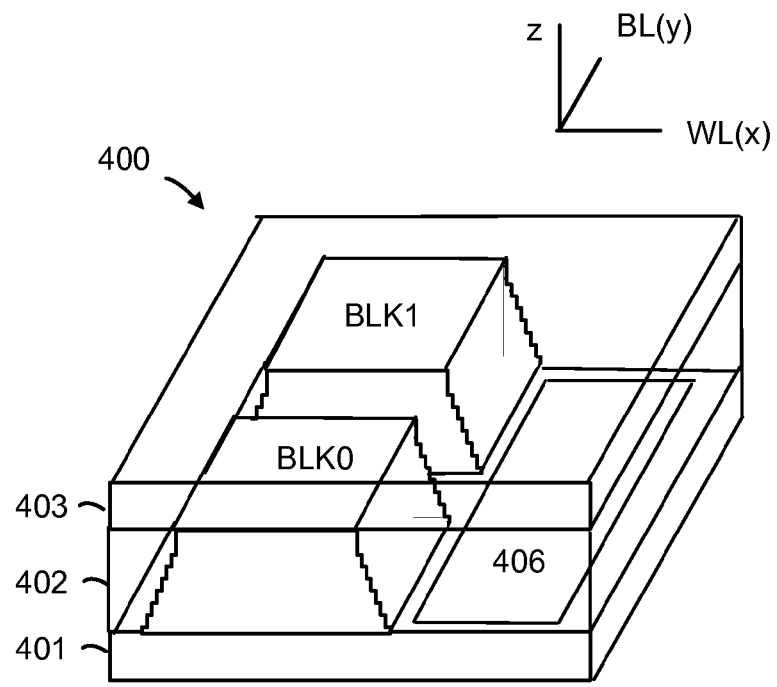
FIG. 4 is a perspective view of a 3D stacked non-volatile memory device.

FIG. 4 is a perspective view of a 3D stacked non-volatile memory device. The 3D memory device 100 includes a substrate 401. In one embodiment, the substrate 401 is formed from silicon. On the substrate are example blocks BLK0 and BLK1 of memory cells and a peripheral area 406 with circuitry for use by the blocks. The substrate 401 can also carry circuitry under the blocks, along with one or more lower metal layers which are patterned in conductive paths to carry signals of the circuitry. The blocks are formed in an intermediate region 402 of the memory device. The circuitry associated with operation of the memory cells may be above or within the substrate 401. In one embodiment, the non-volatile memory device is monolithically formed in one or more physical levels of arrays of memory cells having an active area disposed above the substrate 401.

In an upper region 403 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 5A:
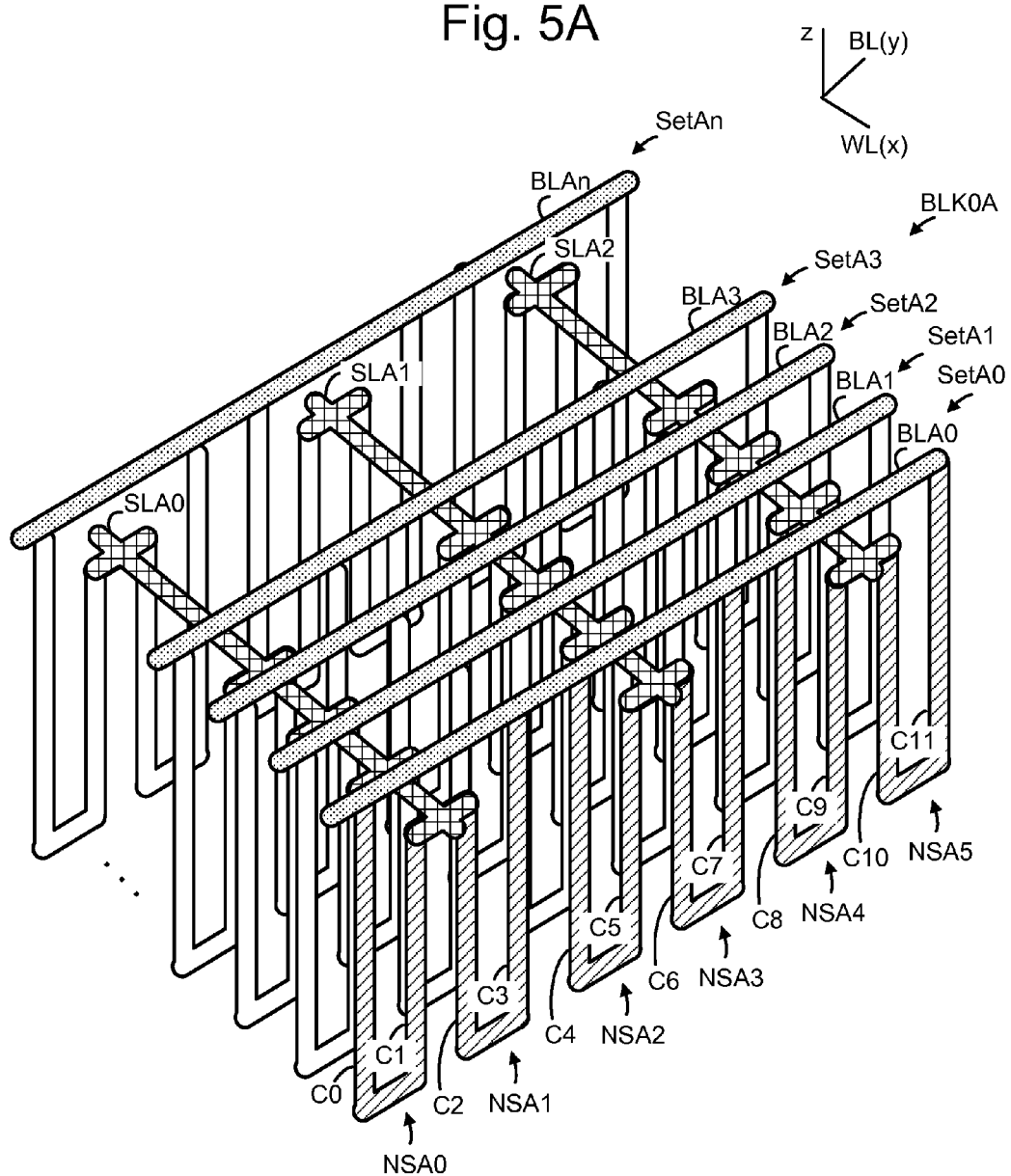
FIG. 5A depicts an embodiment of block BLK0 of FIG. 4 which includes U-shaped NAND strings.

In one embodiment, NAND strings have a U-shape. In another embodiment, NAND strings have a straight shape. FIG. 5A depicts an embodiment of block BLK0 of FIG. 4 which includes U-shaped NAND strings. The block BLK0A includes U-shaped NAND strings arranged in sets (SetA0, . . . , SetAn, where there are n–1 sets of NAND strings in a block). Each set of NAND strings is associated with one bit line (BLA0, BLA1, BLA2, BLA3, BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 5B:
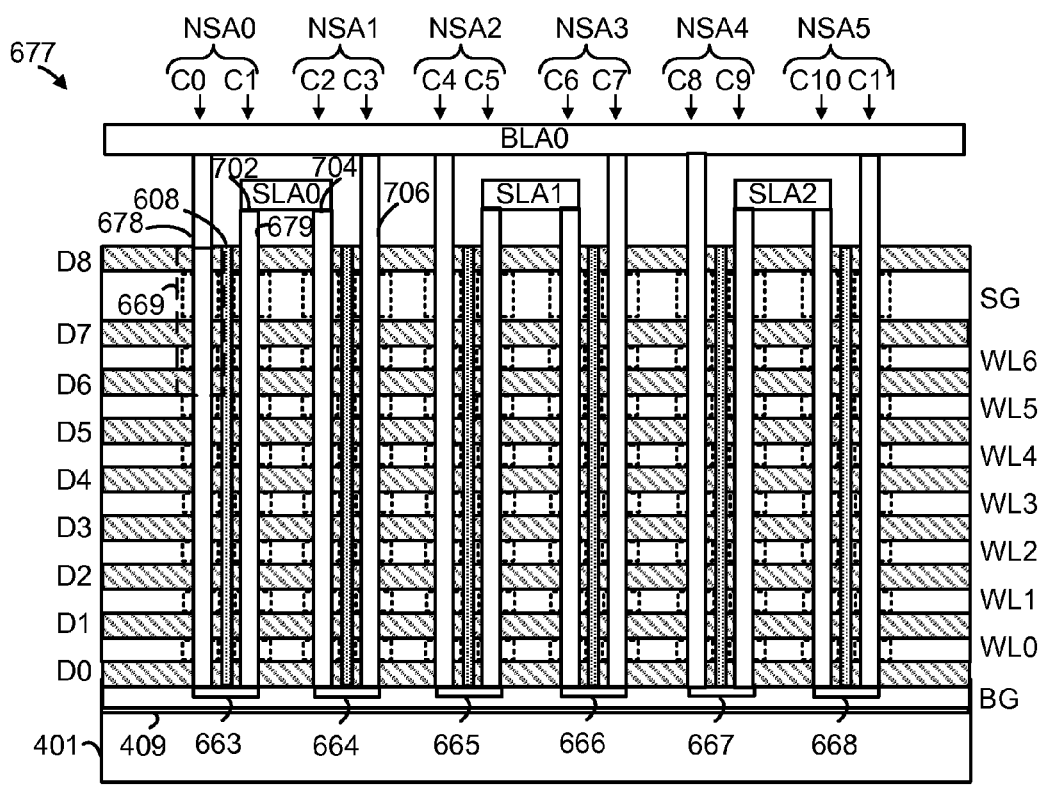
FIG. 5B depicts a cross-sectional view of a block of the 3D non-volatile memory device of FIG. 5A of SetA0 of NAND strings of FIG. 5A.

FIG. 5B depicts a cross-sectional view of a block of the 3D non-volatile memory device of FIG. 5A of SetA0 of NAND strings of FIG. 5A. Columns of memory cells C0 to C11 are depicted in the multi-layer stack. The stack 677 includes the substrate 401, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 663 to 668 which connect the columns. The back gate thus connects the two columns of each U-shaped NAND string. For example, NSA0 includes columns C0 and C1 and connecting portion 663. NSA0 has a drain end 678 and a source end 702. NSA1 includes columns C2 and C3 and connecting portion 664. NSA1 has a drain end 706 and a source end 704. NSA2 includes columns C4 and C5 and connecting portion 665. NSA3 includes columns C6 and C7 and connecting portion 666. NSA4 includes columns C8 and C9 and connecting portion 667. NSA5 includes columns C10 and C11 and connecting portion 668.

The source line SLA0 is connected to the source ends 702 and 704 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 677 extend behind the U-shaped NAND strings depicted in the cross-section, e.g., along the x-axis. The U-shaped NAND strings NSA0 to NSA5 are each in a different sub-block, but are in a common set of NAND strings (SetA0).

Figure 6A:
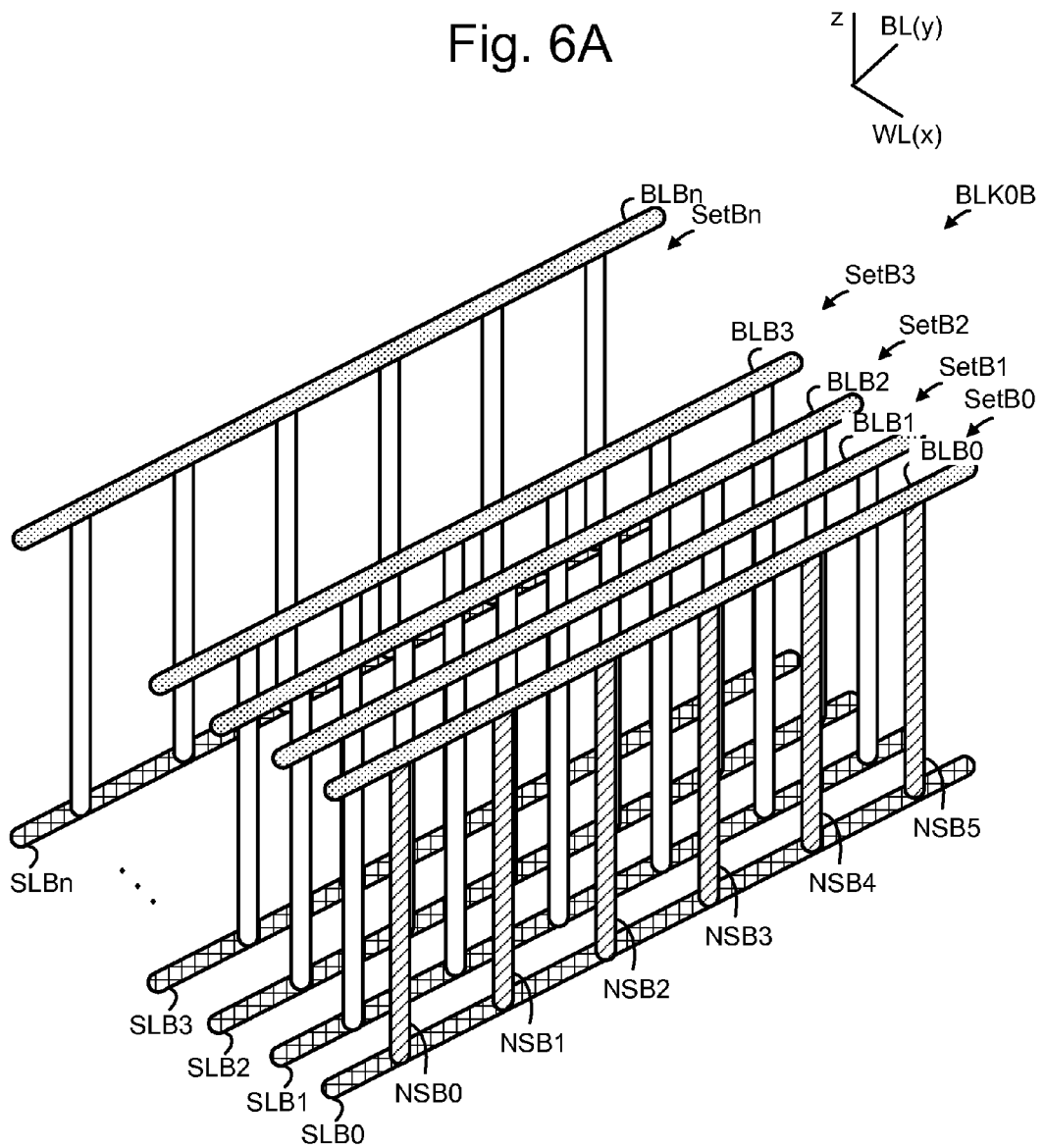
FIG. 6A depicts an embodiment of block BLK0 of FIG. 4 which includes straight NAND strings.

The slit portion 608 from FIG. 6A is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below. Thus, FIG. 5B shows a strings (e.g., NAND strings) of non-volatile storage elements formed above the substrate 401 in multiple physical levels of a three-dimensional memory array. Each of the strings has an active area comprising a channel that extends vertically through the physical levels. Each string comprises non-volatile storage elements and a drain side select gate in the SG layer.

Figure 5C:
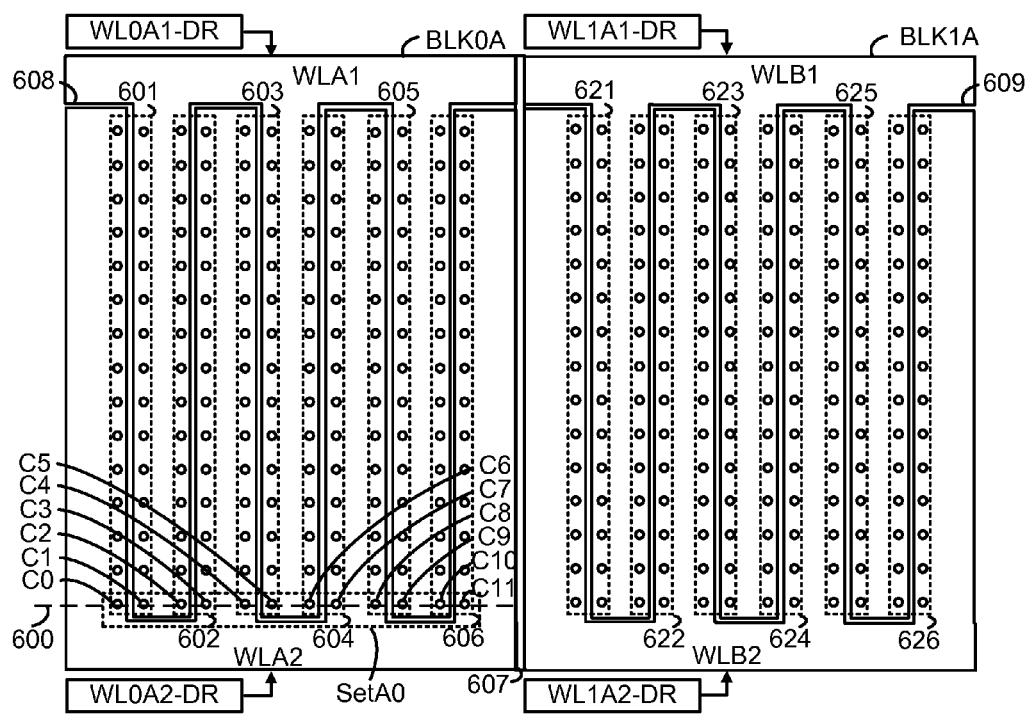
FIG. 5C depicts a top view of a word line layer of a 3D non-volatile memory device having U-shaped NAND strings, consistent with FIG. 5A.

FIG. 5C depicts a top view of a word line layer of a 3D non-volatile memory device 400 having U-shaped NAND strings, consistent with FIG. 5A, showing word line layer portions and associated drivers. This is a representative layer among the multiple word line layers in a stack. Referring also to FIG. 5B, the stack includes alternating dielectric and conductive layers. The dielectric layers include D0 to D8 and may be made of $SiO_2$, for instance. The conductive layers include BG, which is a back gate layer, WL0 to WL6, which form word line layers, e.g., conductive paths to control gates of the memory cells at the layer, and SGD, which forms a select gate layer, e.g., a conductive path to control gates of select gates of NAND strings. The word line layer of FIG. 5C may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 5C depicts a word line layer of the block BLK0A of FIG. 4 and a similar word line layer of block BLK1A as an example. For each block, the word line layer is divided into two word line layer portions, e.g., word line layer portions WLA1 and WLA2 in BLK0A, and word line layer portions WLB1 and WLB2 in BLK1A. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 608 of BLK0A is a single continuous slit which extends in a zig-zag pattern in the block so that the block is divided into two portions, WLA1 and WLA2, which are insulated from one another. Similarly, a slit 609 of BLK1A divides BLK1A into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0A along a line 600 include C0 to C11. The figure represents a simplification, as many more rows of memory holes will typically be used, extending to the right and left in the figure. Also, the figures are not necessarily to scale. The columns of memory cells can be arranged in sub-blocks 601 to 606 in BLK0A and 621 to 626 in BLK1A. When U-shaped NAND strings are used, each sub-block can include two adjacent rows of columns of memory cells. In a sub-block, the adjacent rows are separated by the slit. The columns of memory cells on one side of the slit are drain-side columns (e.g., C0, C3, C4, C7, C8 and C11 in FIG. 5A), and the columns of memory cells on the other side of the slit are source-side columns (e.g., C1, C2, C5, C6, C9 and C10 in FIG. 5A). Note that the pattern of two source-side columns between two drain-side columns repeats in the y-direction.

Word line drivers WL0A1-DR, WL0A2-DR, WL1A1-DR and WL1A2-DR independently provide signals such as voltage waveforms to the word line layer portions WLA1, WLA2, WLB1 and WLB2, respectively.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, this is 192K NAND strings. With straight NAND strings, this is 384 k NAND strings.

Figure 5D:
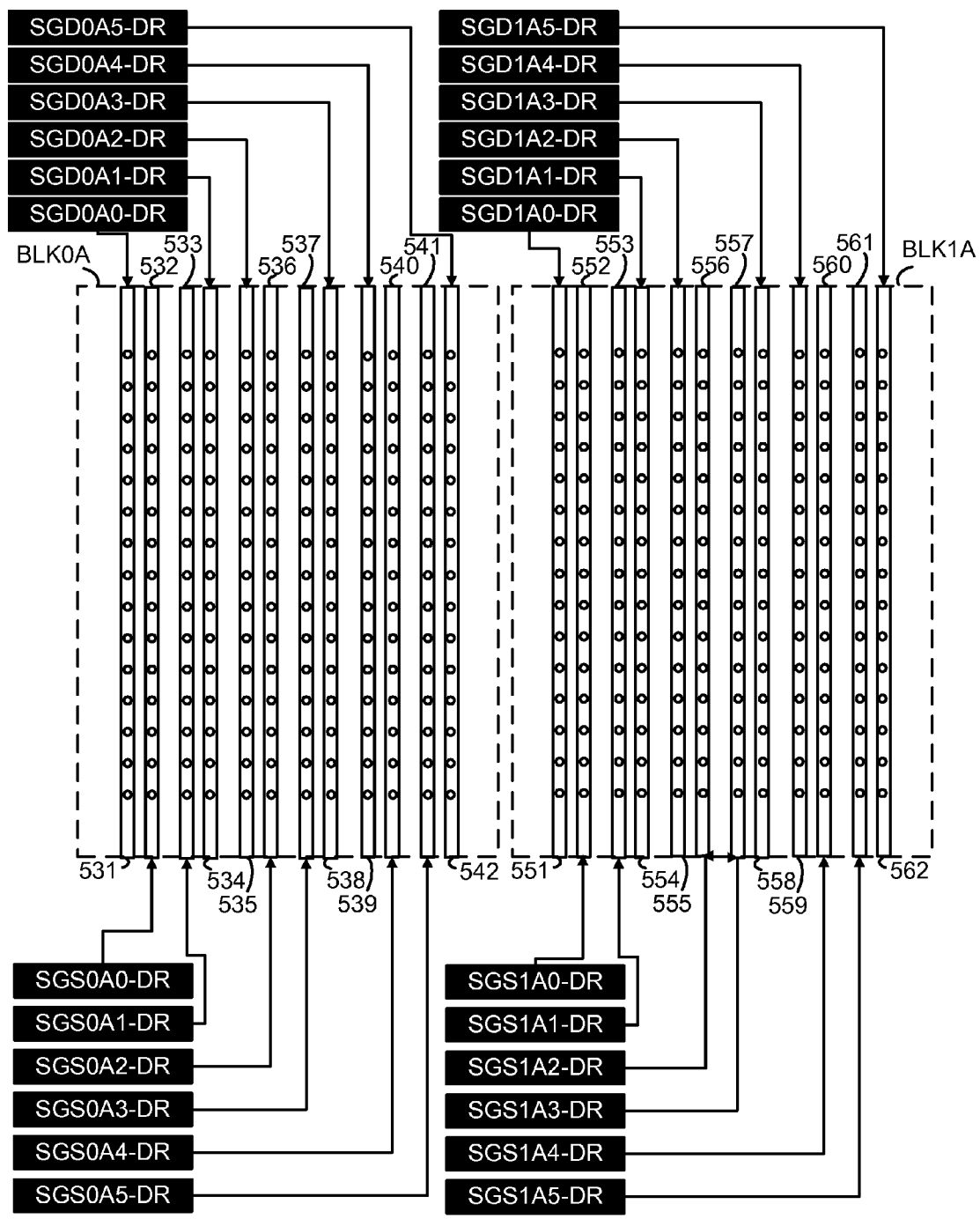
FIG. 5D depicts a top view of a select gate layer of the 3D non-volatile memory device of FIG. 5A.

FIG. 5D depicts a top view of a select gate layer of the 3D non-volatile memory device of FIG. 5A, showing drain-side select gate lines, source-side select gate lines and associated drivers. For example, this can represent layer SG of FIG. 5A. A separate select gate line, e.g., a conductive line or path, is associated with each row of columns of memory cells. Moreover, separate select gate lines can be connected to the drain- and source-side columns of a U-shaped NAND string. For example, BLK0A includes drain-side select gate lines 531, 534, 535, 538, 539 and 542, which are driven by select gate drivers SGD0A0-DR to SGD0A5-DR, respectively, and source-side select gate lines 532, 533, 536, 537, 540 and 541, which are driven by select gate drivers SGS0A0-DR to SGS0A5-DR, respectively (DR denotes driver). Similarly, BLK1 includes drain-side select gate lines 551, 554, 555, 558, 559 and 562, which are driven by select gate drivers SGD6-DR to SGD11-DR, respectively, and source-side select gate lines 552, 553, 556, 557, 560 and 561, which are driven by select gate drivers SGS0A1-DR to SGS1A5-DR, respectively. The select gate drivers provide signals such as voltage waveforms to the select gate lines.

FIG. 6A depicts an embodiment of block BLK0 of FIG. 4 which includes straight NAND strings. The block BLK0B includes straight NAND strings arranged in sets (SetB0, SetB1, SetB2, SetB3, . . . , SetBn, where there are n–1 sets in a block). Each set of NAND strings is associated with one bit line (BLB0, BLB1, BLB2, BLB3, BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 6B:
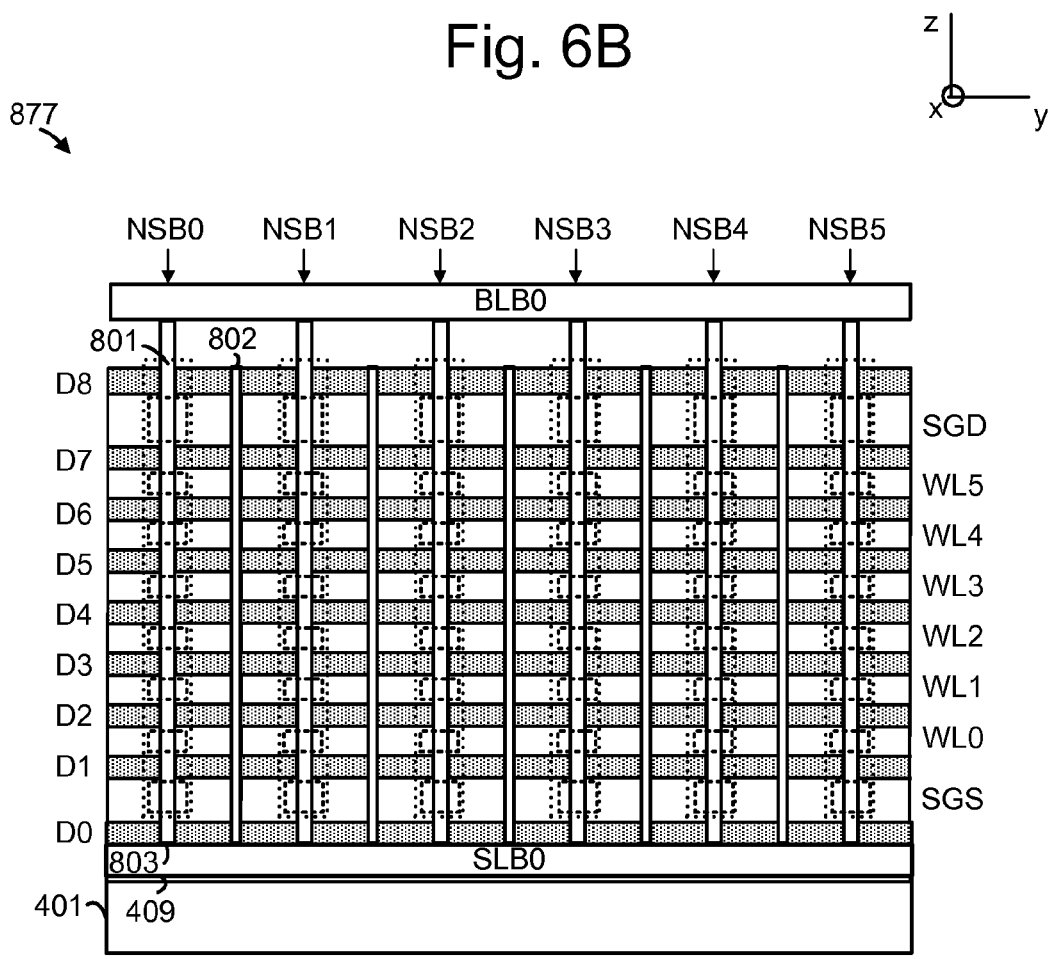
FIG. 6B depicts a cross-sectional view of a block of the 3D non-volatile memory device of FIG. 6A having straight strings.

FIG. 6B depicts a cross-sectional view of a block of the 3D non-volatile memory device of FIG. 6A having straight strings. The view of a portion of setB0 of NAND strings of FIG. 6A. Columns of memory cells corresponding to NAND strings NSB0 to NSB5, respectively, are depicted in the multi-layer stack. The stack 877 includes a substrate 401, an insulating film 409 on the substrate, and a portion of a source line SLB0. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 803 and a drain end 801. The slit 802 from FIG. 6B is also depicted with other slits. A portion of the bit line BLB0 is also depicted. Dashed lines depict memory cells and select gates, as discussed further below.

A region 669 of the stack is shown in greater detail in FIG. 7A. FIG. 7A depicts a close-up view of the region 669 of the column C0 of FIG. 5B, showing a drain-side select gate SGD0 and a memory cell MC6,0. FIG. 7B depicts a cross-sectional view of the column C0 of FIG. 7A. Each layer is ring-shaped in one possible approach, except the core filler which is cylindrical. Recall that region 669 of the column C0 of FIG. 5B is for the U-shaped 3D NAND string example. However, the diagrams and discussion for FIGS. 7A and 7B also apply to a straight 3D NAND string.

The region 669 shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 696, a nitride such as SiN as a charge trapping layer can be deposited as layer 697, a tunnel oxide can be deposited as layer 698, a polysilicon body or channel can be deposited as layer 699, and a core filler dielectric can be deposited as region 695. The polysilicon body or channel 699 may also be referred to as an active area. Additional memory cells are similarly formed throughout the columns.

When such a memory cell is programmed, electrons are stored in a portion of the charge trapping layer which is associated with the memory cell. For example, electrons are represented by "–" symbols in the charge trapping layer 697 for MC6,0. These electrons are drawn into the charge trapping layer from the polysilicon body, and through the tunnel oxide. The threshold voltage of a memory cell is increased in proportion to the amount of stored charge.

Figure 8:
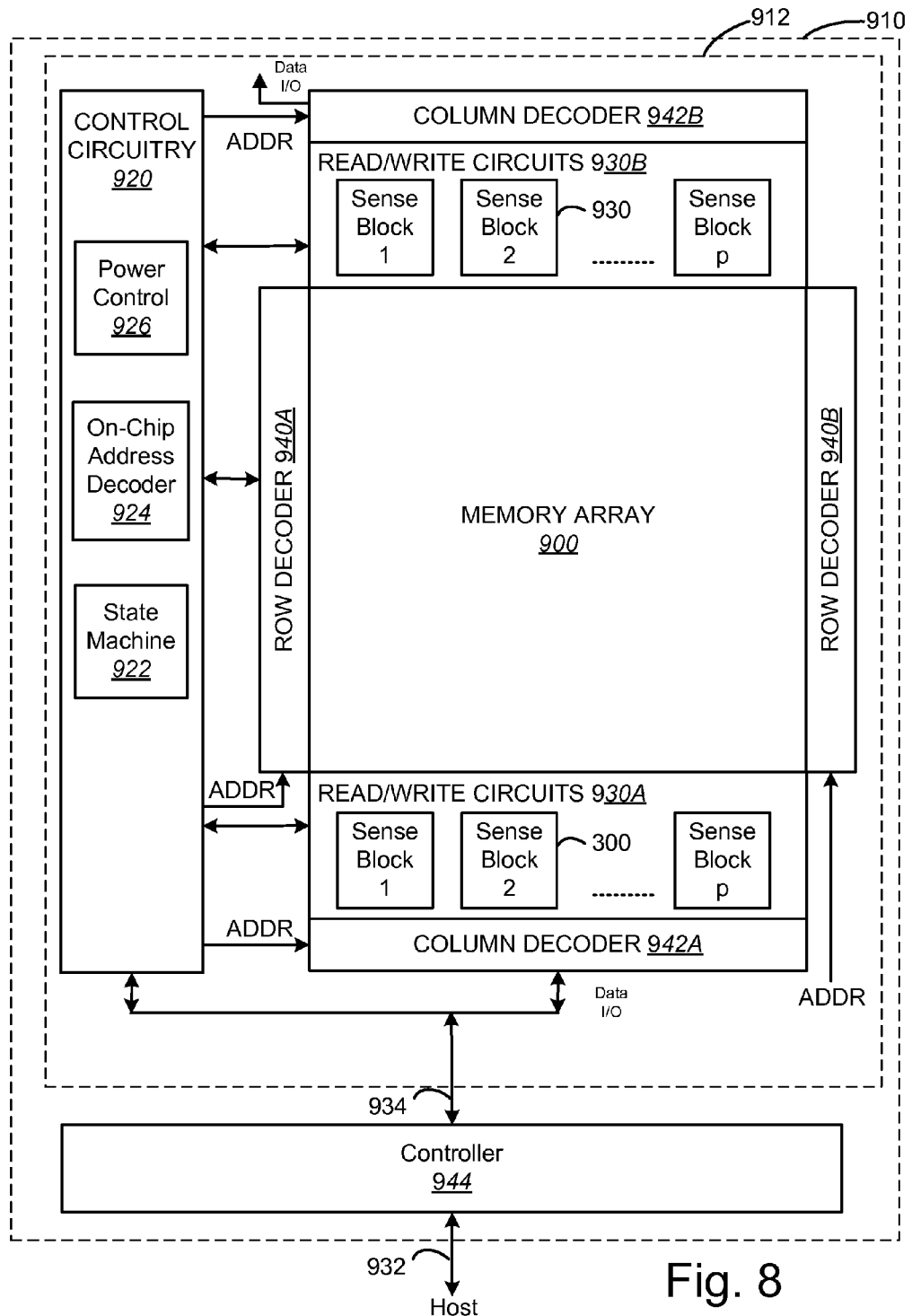
FIG. 8 illustrates a non-volatile storage device that may include one or more memory die or chips.

FIG. 8 illustrates a non-volatile storage device 910 that may include one or more memory die or chips 912. Memory die 912 includes an array 900 (two-dimensional memory structure or three dimensional memory structure) of memory cells, control circuitry 920, and read/write circuits 930A and 930B. In one embodiment, the memory array 900 has a 3D NAND configuration. In one embodiment, the memory cells array has a 2D NAND configuration.

In one embodiment, access to the memory array 900 by the various peripheral circuits is implemented in a symmetric fashion, on opposite sides of the array, so that the densities of access lines and circuitry on each side are reduced by half. The read/write circuits 930A and 930B include multiple sense blocks 930 which allow a page of memory cells to be read or programmed in parallel. The memory array 900 is addressable by word lines via row decoders 940A and 940B and by bit lines via column decoders 942A and 942B. In a typical embodiment, a controller 944 is included in the same memory device 910 (e.g., a removable storage card or package) as the one or more memory die 912. Commands and data are transferred between the host and controller 944 via lines 932 and between the controller and the one or more memory die 912 via lines 934. One implementation can include multiple chips 912.

Control circuitry 920 cooperates with the read/write circuits 930A and 930B to perform memory operations on the memory array 900. The control circuitry 920 includes a state machine 922, an on-chip address decoder 924 and a power control module 926. The state machine 922 provides chip-level control of memory operations. The on-chip address decoder 924 provides an address interface to convert between the address that is used by the host or a memory controller to the hardware address used by the decoders 940A, 940B, 942A, and 942B. The power control module 926 controls the power and voltages supplied to the word lines and bit lines during memory operations. In one embodiment, power control module 926 includes one or more charge pumps that can create voltages larger than the supply voltage.

In one embodiment, one or any combination of control circuitry 920, power control circuit 926, decoder circuit 924, state machine circuit 922, decoder circuit 942A, decoder circuit 942B, decoder circuit 940A, decoder circuit 940B, read/write circuits 930A, read/write circuits 930B, and/or controller 944 can be referred to as one or more managing circuits, managing circuitry, or the like.

Figure 9:
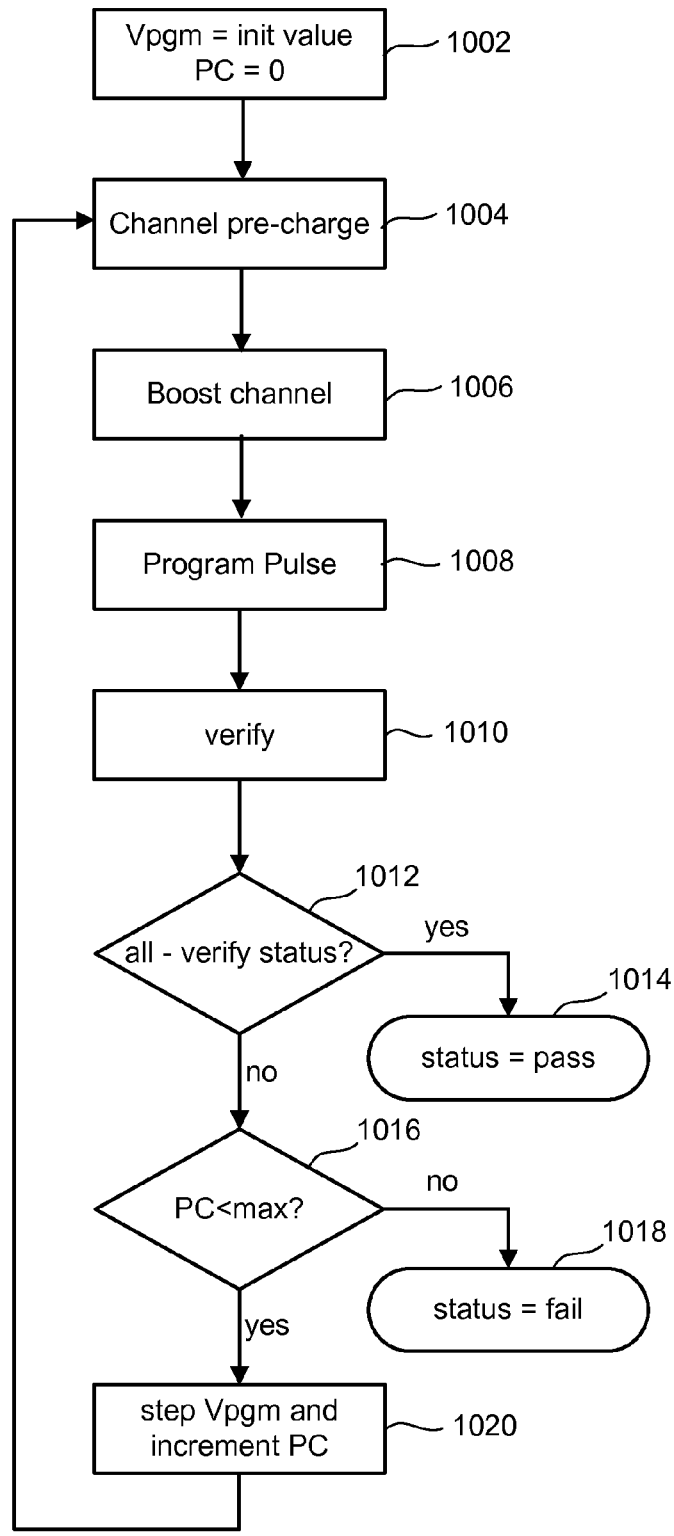
FIG. 9 is a flowchart describing one embodiment of a programming process.

FIG. 9 is a flowchart describing one embodiment of a programming process. In one embodiment, memory cells in a 2D NAND memory array are programmed. In one embodiment, memory cells in a 3D NAND memory array are programmed. In step 1002, the program voltage ($V_{PGM}$) is set to an initial value. This is the program voltage that will be applied to the selected word line for the first iteration of the process. This program voltage will be stepped up during the process. Also, in step 1002, a program counter (PC) is initialized to zero. The program counter tracks how many program pulses have been applied, such that programming can be aborted if the memory cell does not program within an allowed number of program pulses.

In step 1004, channels of NAND strings are pre-charged. This is referred to herein as a pre-charge phase. Further details are shown and described with respect to FIGS. 12, 13, 14 and 15. Embodiments disclosed herein reduce peak current during pre-charge.

In step 1006, channels of unselected NAND strings are boosted. An unselected NAND string is one that does not have a memory cell being programmed. That is, the program pulse to be applied to the selected word line should not program any memory cells on an unselected NAND string. Boosting the channels of unselected NAND strings helps to prevent program disturb.

In step 1008, a program pulse is applied to the selected word line. In step 1010, a verification process is performed. In step 1012, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed Step 1012 is referring to all states having completed programming.

If verification passes, the programming process is completed successfully (status=pass) in step 1014. If all of the memory cells are not all verified, then it is determined whether the program counter (PC) is less than a maximum value such as 20. If the program counter (PC) is not less than max (step 1016), then the program process has failed (step 1018). If the program counter (PC) is less than a maximum value (e.g., 20), then the program counter (PC) is incremented by 1 and the program voltage is stepped up to the next value in step 1020. Subsequent to step 1020, the process loops back to step 1004 to prepare for and apply the next program pulse to the selected word line.

Figure 10:
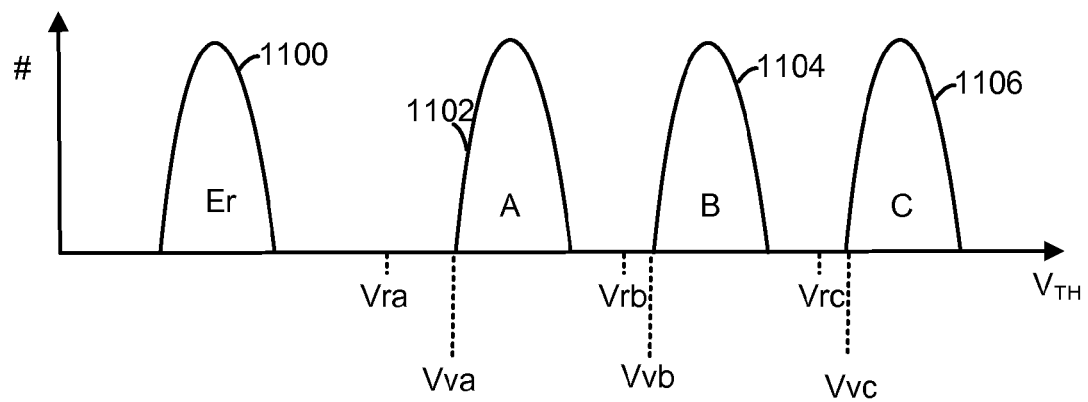
FIG. 10 depicts an example set of threshold voltage distributions for a four-state memory device in which each storage element stores two bits of data.

FIG. 10 depicts an example set of threshold voltage distributions for a four-state memory device in which each storage element stores two bits of data. A first threshold voltage ($V_{TH}$) distribution 1100 is provided for erased (Er-state) storage elements. Three $V_{TH}$ distributions 1102, 1104 and 1106 represent programmed states A, B and C, respectively. In one embodiment, the threshold voltages in the Er-state are negative and the threshold voltages in the A, B and C distributions are positive. However, all or a part of the threshold distribution in the Er-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In some conventional programming techniques, bit lines associated with memory cells that are not being programmed ("inhibited" or "unselected" bit lines) are kept at a program inhibit voltage. For some architectures, the program inhibit voltage could be about 2.2V, but this could vary based on design. Bit lines associated with memory cells that are being programmed ("selected" bit lines) are kept at a program enable voltage. For some architectures, the program enable voltage could be about 0V, but this could vary based on design.

Figure 11:
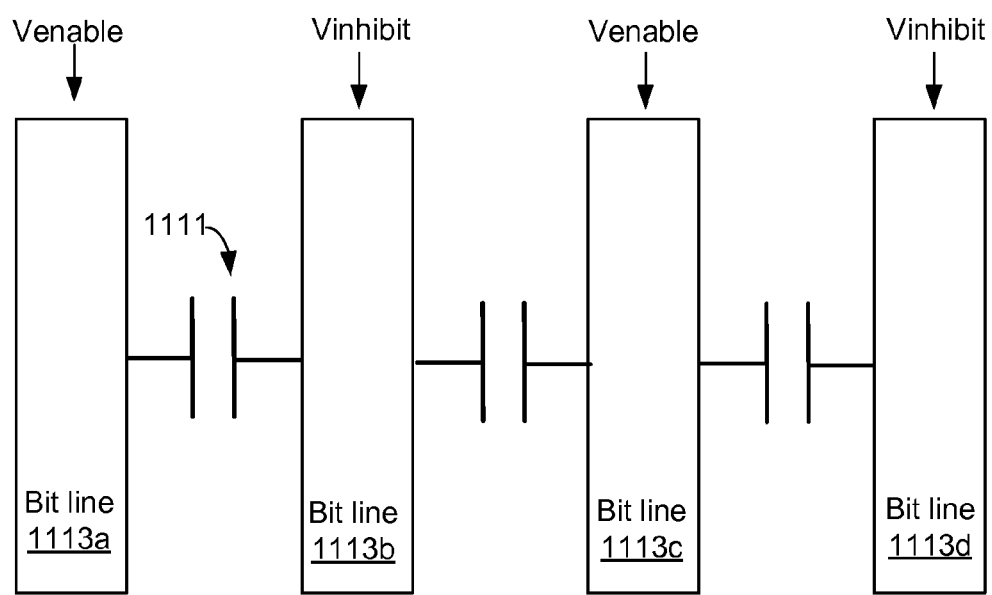
FIG. 11 shows an example in which some unselected bit lines are at a program inhibit voltage ($V_{INHIBIT}$) and selected bit lines are at a program enable voltage ($V_{ENABLE}$).

FIG. 11 shows an example in which some unselected bit lines are at a program inhibit voltage ($V_{INHIBIT}$) and selected bit lines are at a program enable voltage ($V_{ENABLE}$). For the sake of example, two of the bit lines 1113a, 1113c are selected for programming and two bit lines 1113b, 1113d are inhibited from programming. By the bit line being selected or inhibited for programming it is meant that a memory cell associated with that bit line is either selected or inhibited from programming. In this example, the unselected bit lines are next to a selected bit line. The bit lines 1113 in FIG. 11 may correspond to bit lines in the example 2D NAND or 3D NAND architecture examples disclosed herein, but are not limited thereto.

Note that the bit lines 1113 are formed from metal in one embodiment. For example, the bit lines could be formed from Tungsten. Also, there is typically some dielectric material between the bit lines. FIG. 11 depicts parasitic capacitance 1111 between neighboring bit lines 1113 that may result from the foregoing metal/dielectric structure.

When charging the inhibited bit line to the program inhibit voltage this may in effect result in charging up a capacitor. This can potentially result in a large peak current consumption, as in indicated by Equation 1.

$$I = C_{par} dv/dt \qquad (1)$$

In Equation 1, $C_{par}$ refers to the parasitic capacitance 1111. Note that the shorter the amount of time that is used to charge up the inhibited bit line, the larger the peak current will be. Therefore, to reduce the peak current, the time to charge up the unselected bit line could be increased, but this comes at the expense of increasing the programming time. An advantage of embodiments disclosed herein is to rapidly charge the unselected bit lines to a program inhibit voltage. Another advantage of embodiments disclosed herein is to charge the unselected bit lines to a program inhibit voltage while keeping the peak current consumption relatively low. Still another advantage of embodiments disclosed herein is to charge the unselected bit lines to a program inhibit voltage while reducing energy consumption. Note that many memory devices are battery operated, hence reducing energy consumption may be desirable.

Figure 12:
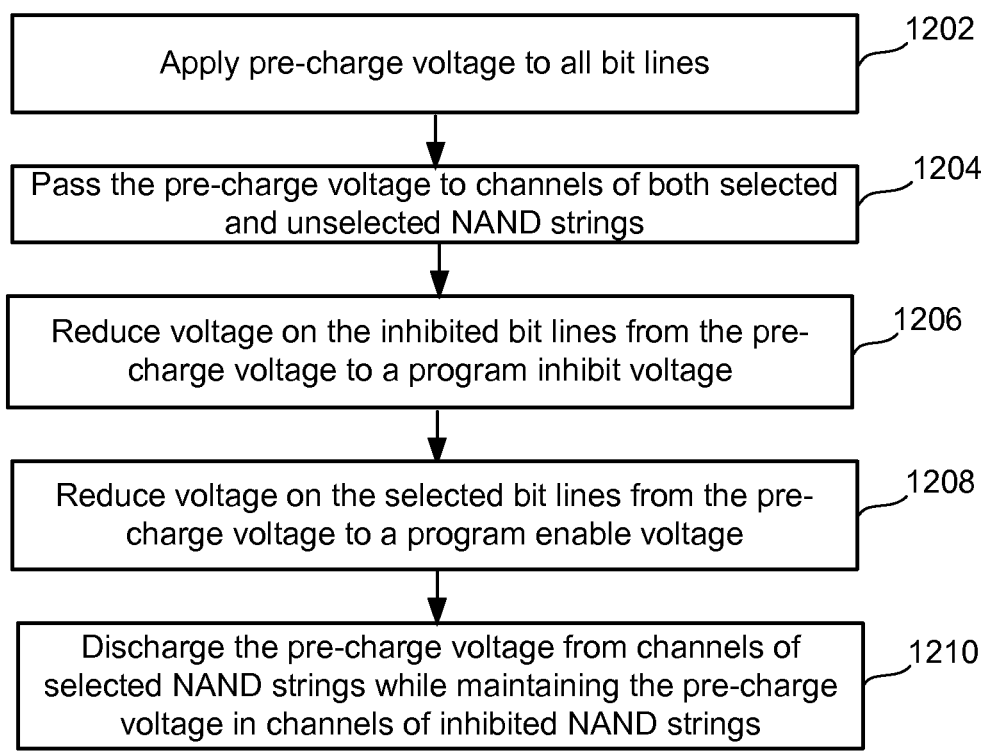
FIG. 12 is a flowchart of one embodiment of a pre-charge phase of programming non-volatile storage.

FIG. 12 is a flowchart of one embodiment of a pre-charge phase of programming non-volatile storage. This process could be used for 2D NAND memory, 3D NAND memory, but is not limited thereto. This is one embodiment of step 1004 from FIG. 9. In step 1202, a pre-charge voltage is applied to both selected and unselected bit lines. Note that because both selected and unselected bit lines are charged together to the same voltage, this reduces peak current consumption substantially. Step 1202 may include raising the bit lines from 0V to a pre-charge voltage, as one example. The pre-charge voltage will be used to pre-charge the channels of the NAND strings prior to programming. One reason for pre-charging the channels is to make it easier to boost the channels to a desired boosting voltage during the programming phase. Hence, the magnitude of the pre-charge voltage may be set accordingly. An example magnitude for the pre-charge voltage is about 2 volts, but the pre-charge voltage could be higher or lower.

Using the example in which neighboring bit lines are considered to be plates of a capacitor, since both plates are being charged to the pre-charge voltage there is no voltage difference between the two plates. Hence, current due to parasitic capacitance between neighboring bit lines is reduced or eliminated. Of course, there will still be some current consumed by the charging of the individual bit lines.

In step 1204, the pre-charge voltage is passed to channels of both selected and unselected bit lines. This may include turning on the drain side select gates associated with both selected and unselected bit lines. Turning on the drain side select gates may connect the NAND string to its respective bit line. This has the effect of passing the pre-charge voltage to the channels of the NAND strings associated with both selected and unselected bit lines. Herein, a NAND string associated with a selected bit line will be referred to as a selected NAND string. Passing the pre-charge voltage does not require that the channel voltage is exactly the same as the pre-charge voltage applied to the bit lines.

In step 1206, the voltage on the unselected bit lines is reduced from the pre-charge voltage to a program inhibit voltage. Step 1206 may be performed with the unselected NAND strings disconnected from their respective bit strings. Thus, the drain side select gates on unselected NAND strings may be off during step 1206. This may help to prevent the pre-charge voltage in the channels of unselected NAND strings from being removed to the bit lines. The program inhibit voltage is a voltage that inhibits memory cells on the unselected NAND strings from being programmed. In one embodiment, this is achieved by cutting off the unselected NAND strings from their respective bit lines. Thus, the program inhibit voltage is a voltage that is adequate to keep the drain side select gates of unselected NAND strings off, in one embodiment. Note that this may also depend on voltages of the other terminals of the drain side select gate. Since the NAND channel has been pre-charged, the NAND channel side of the drain side select gate may act as the drain side, and the bit line side of the drain side select gate may act as the source side. Thus, the voltage of the unselected bit line relative to the gate of the drain side select gate may determine whether the drain side select gate is on/off.

In step 1208, the voltage on the selected bit lines is reduced from the pre-charge voltage to the program enable voltage. Steps 1206 and 1208 may be performed together such that the voltage on the unselected bit lines is reduced from the pre-charge voltage to the program inhibit voltage while the voltage on the selected bit lines is reduced from the pre-charge voltage to the program enable voltage.

The program enable voltage is a voltage that allows a selected memory cell on the a selected NAND string to be programmed. In one embodiment, this includes connecting the selected NAND strings to their respective bit lines. Thus, the program enable voltage is a voltage that is adequate to turn on the drain side select gates of selected NAND strings at least during the programming phase, in one embodiment. The program enable voltage may be passed to the channels of the selected NAND strings. For effective programming it may be desirable for this to be a low voltage. A reason for this is to create a high voltage difference between the control gate and channel. The program enable voltage is about 0V, in one embodiment. However, the program enable voltage is not required to be 0V.

In step 1210, the pre-charge voltage is discharged from the channels of the selected NAND strings while maintaining the pre-charge voltage in the channels of the inhibited NAND strings. The pre-charge voltage may be removed from channels of selected NAND strings by connecting selected NAND strings to their respective bit lines. In one embodiment, the drain side select gates of selected NAND strings are turned on to connect the selected NAND strings to their respective bit lines.

However, the drain side select gates for unselected bit lines may be turned off. Step 1210 includes applying a suitable voltage to the drain side select gates of selected and unselected NAND strings to achieve the foregoing. Note that for some architectures, there is a single drain side select line that controls the drain side select gates for both the unselected and selected NAND strings (at least for a group being programmed). Thus, the ability to keep some of the drain side select gates off and others on may depend on the voltages applied to the bit lines. It could also depend on the potential of the NAND string channel as previously discussed.

Figure 13:
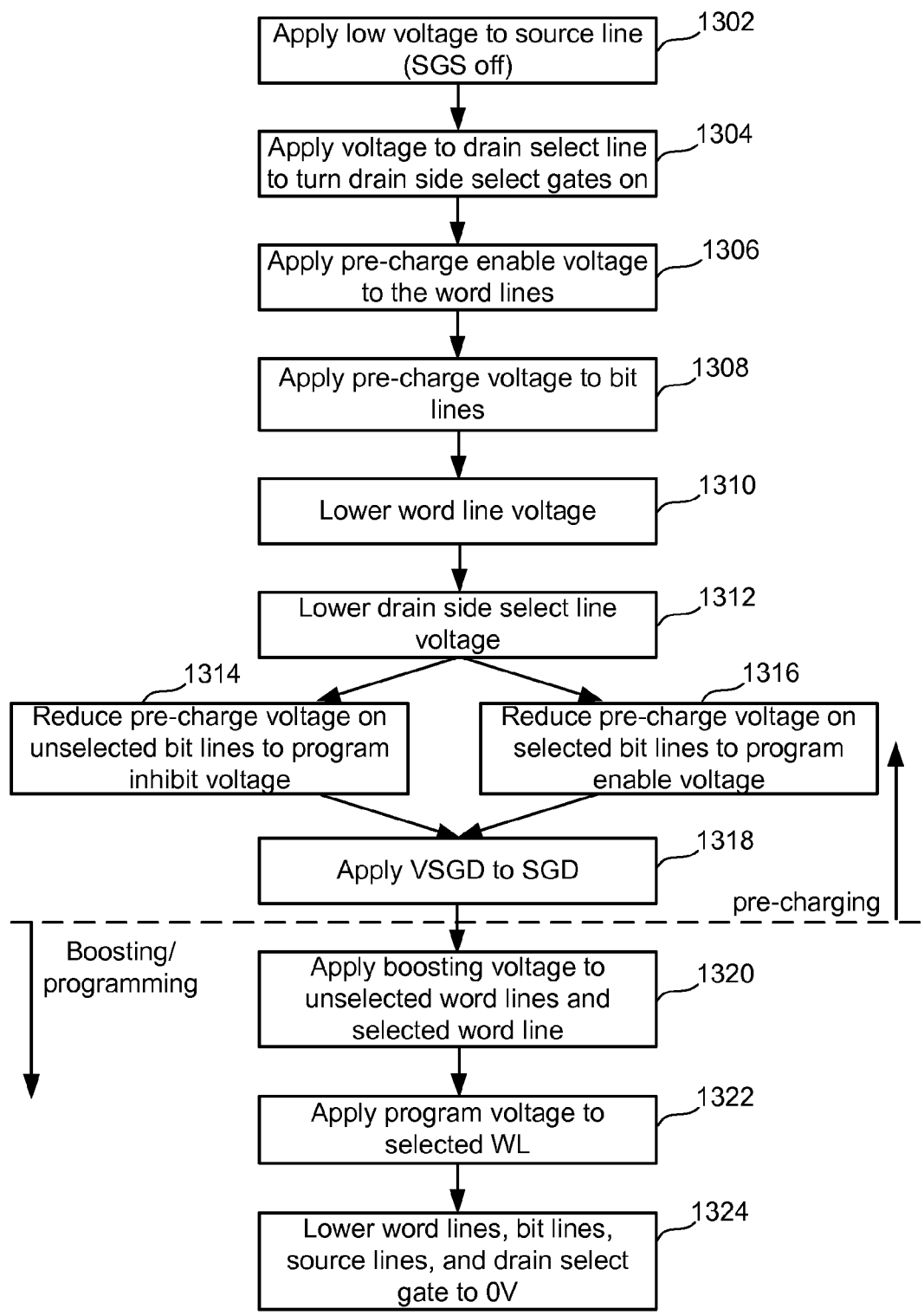
FIG. 13 is a flowchart of one embodiment of programming non-volatile storage.
Figure 14:
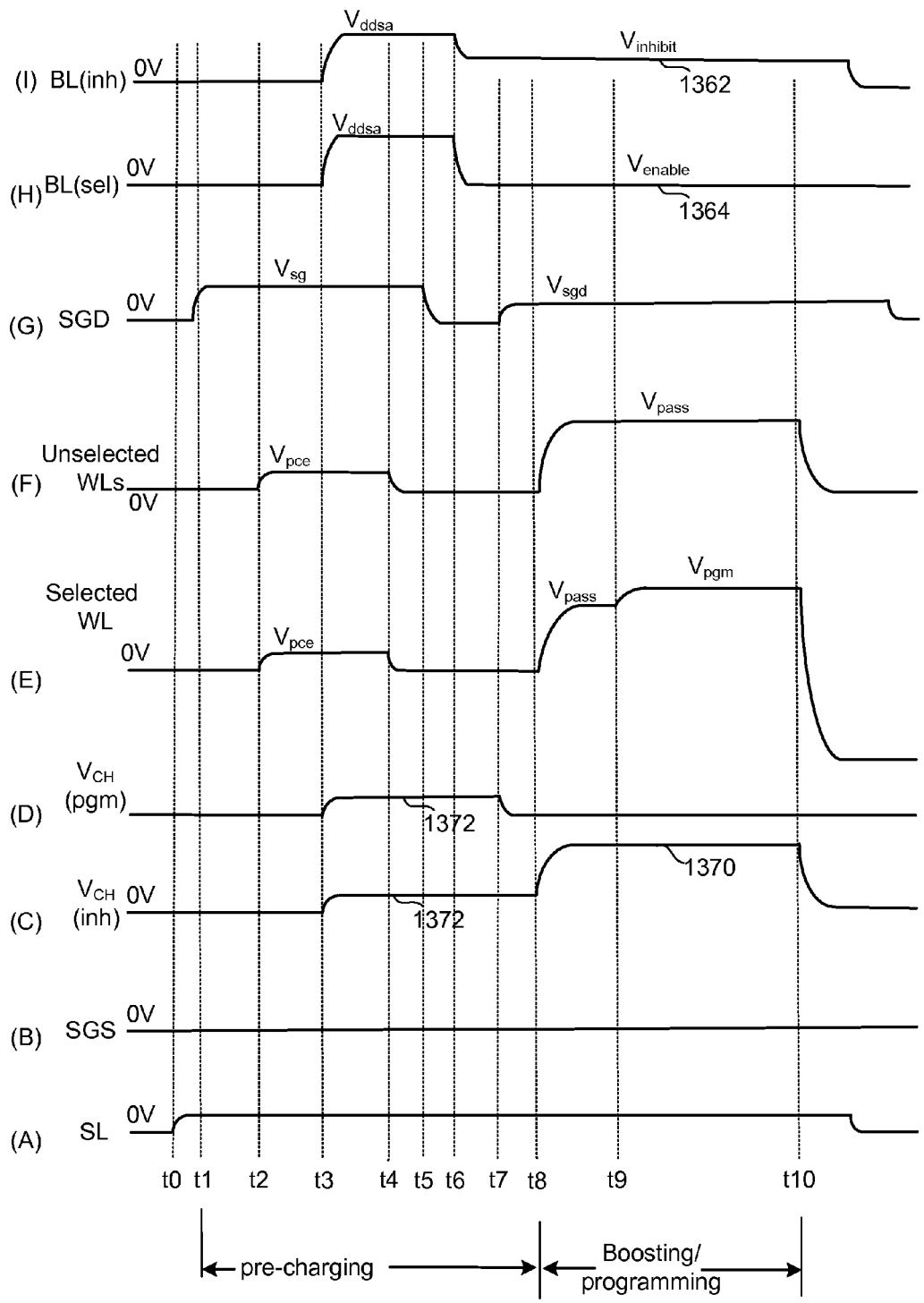
FIGS. 14(A)-14(I) show timing of various signals during one embodiment of the process of FIG. 13, as well as voltages in the channels of NAND strings.

FIG. 13 is a flowchart of one embodiment of programming non-volatile storage. This process is used to program 3D NAND in one embodiment. This process is used to program 2D NAND in one embodiment. Steps 1302 through 1318 correspond to the pre-charge phase (FIG. 9, 1004). Steps 1320 through 1324 correspond to the boosting and programming phase (FIG. 9, steps 1006 and 1008). Thus, the process of FIG. 13 is a portion of one loop of the programming process of FIG. 9. The programming process of FIG. 9 could be used to program one memory cell on each NAND string.

Note that during any given loop of the process of FIG. 9, some NAND strings will be inhibited and others selected for programming. Thus, a program inhibit voltage may be applied to inhibit some bit lines, whereas a program enable voltage may be applied to other bit lines.

FIGS. 14(A)-14(I) show timing of various signals during one embodiment of the process of FIG. 13, as well as voltages in the channels of NAND strings. The timing diagram is divided to illustrate the pre-charge phase and boosting/programming phase of the programming process. [Note that the pre-charge phase and boosting/programming phase do not necessarily form the entire programming sequence.] The voltage signals illustrated for the pre-charge phase from time t1-t8 can be used at step 1004 of FIG. 9. The voltage signals illustrated for the boosting phase from time t8-t10 can be used at steps 1006-1008 of FIG. 9. Note this is one possible timing flow, but that other sequences of applying the signals can be used.

A low voltage (e.g., about 1.0V-1.5V) is applied to the source line at step 1302, where it may remain for the duration of the programming process. For example, at t0, FIG. 14(A) shows the low voltage applied to SL. The source line SL is kept at 0V in some embodiments.

Note that the source side select gate line SGS may remain at 0V throughout the programming process. This keeps the source side select gates off throughout the process, in one embodiment. Thus, the source select gates are placed into isolation mode, in one embodiment.

The drain select gates are turned on at step 1304, for example, by applying a positive bias of about $V_{SG}$. For example, FIG. 14(G) shows $V_{SG}$ applied to SGD at t1. This step turns on the drain side select gates of both selected and unselected NAND strings. $V_{SG}$ is on the order of about 3.5V-4.5V, in one embodiment.

At step 1306, a pre-charge enable voltage $V_{PCE}$ is applied to word lines associated with the NAND strings. For example, FIGS. 14(E) and 14(F) show $V_{PCE}$ applied to both the selected word line and the unselected word lines at t2. In one embodiment, $V_{PCE}$ is equal to 0V, however, other voltages can be used as well. Thus, although the timing diagram depicts $V_{PCE}$ as being greater than 0V, this is for the purpose of explanation. $V_{PCE}$ is not required to be greater than 0V. In one embodiment, the pre-charge enable voltage is applied to all word lines. In one embodiment, the pre-charge enable voltage is applied at least to the word lines between the selected word line and the drain side select gate. In this case, the pre-charge enable voltage may also be applied to the selected word line.

At step 1308, a pre-charge voltage is applied to both the selected bit lines and the unselected bit lines. For example, FIGS. 14(H) and 14(I) show $V_{DDSA}$ applied to both the selected bit lines and the unselected bits lines at t3. Because the drain side select gates are turned on at this time, the bit line voltage will be passed to the channels of the NAND strings. This results in charging the potential of the NAND string channel to approximately $V_{DDSA}$. FIG. 14(C) shows the voltage potential in the channels of inhibited NAND strings increasing to the pre-charge voltage 1372 at t3. Similarly, FIG. 14(D) shows the voltage potential in the channels of selected NAND strings increasing to the pre-charge voltage 1372 at t3.

Note that by increasing the voltage on both the selected bit lines and the unselected bit lines together to the same voltage at time t3, the peak current is reduced.

At step 1310, the pre-charge enable voltage $V_{PCE}$ on the word lines is removed. FIGS. 14(F) and (G) show the word line voltage decreased to 0V at t4.

At step 1312, the drain side select line voltage is lowered. FIG. 14(G) shows the SGD decreased from $V_{SG}$ to 0V at t5. Lowering the drain side select line voltage turns off the drain side select gates of both the selected NAND strings and the unselected NAND strings. This disconnects both selected and unselected NAND strings from their respective bit lines. This allows the pre-charge voltage in the channels of the unselected NAND strings to be maintained.

Steps 1314 and 1316 may be performed together. In step 1314, the voltage on the unselected bit lines is reduced to a program inhibit voltage. FIG. 14(I) shows the voltage on unselected bit lines being reduced from the pre-charge voltage $V_{DDSA}$ to $V_{INHIBIT}$ 1362 at t6. In step 1316, the voltage on the selected bit lines is reduced to a program enable voltage. FIG. 14(H) shows the voltage on selected bit lines being reduced from the pre-charge voltage $V_{DDSA}$ to $V_{ENABLE}$ 1364 at t6. In one embodiment, values are stored in a latch associated with each NAND string to indicate whether the NAND string should be programmed or inhibited.

In one embodiment, the voltage difference between the program inhibit voltage 1362 and the program enable voltage 1364 is less than the pre-charge voltage $V_{DDSA}$. For example, $V_{DDSA}$ may be about 2.2V, $V_{ENABLE}$ may be about 0V, and $V_{INHIBIT}$ may be greater than about 0.7V, but less than 2.2V.

At step 1318, the voltage on the drain side select line is increased to a voltage that allows the unselected bit lines to remain disconnected from their bit NAND strings, but for which the selected bit lines are connected to their NAND strings. In other words, the drain side select gates for unselected NAND strings are off, whereas the drain side select gates for selected NAND strings are on. Note that the channel region of those NAND strings that are to be inhibited from programming are cutoff from their bit line, enabling boosting of those channel regions as hereinafter described. FIG. 14(G) shows the voltage on SGD increasing to $V_{SGD}$ at t7.

Note that the voltages on the bit lines may also impact whether the drain side select gates are on/off. In one embodiment, the voltages $V_{INHIBIT}$ and $V_{SGD}$ are suitable values to keep the drain side select gates of unselected NAND strings off. On the other hand, the voltages $V_{ENABLE}$ and $V_{SGD}$ are suitable values to keep the drain side select gates of selected NAND strings on.

With the drain side select gates of the selected NAND strings on, their channels can discharge to the bit lines. Also, their channel voltage should end up at about the bit line voltage. FIG. 14(D) shows the channel potential of the selected NAND strings reducing to about 0V after t7. Thus, the NAND strings that are to be programmed, will remain connected to their respective bit lines. The channel regions remain at $V_{ENABLE}$ (e.g., 0V) and a path is provided to draw electrons to the floating gates (or other charge storage region, such as a dielectric charge trapping region) of the memory cells when the programming voltage is applied.

However, the drain side select gates of the unselected NAND strings are off at this time, which allows the unselected NAND strings to maintain the pre-charge channel potential. FIG. 14(C) shows the channel potential of the unselected NAND strings maintaining the pre-charge potential 1372 after t7.

At step 1320, a boosting voltage (e.g., $V_{PASS}$) is applied to both unselected word lines and to the selected word line. FIGS. 14(E) and 14(F) show the voltage on the selected and unselected word lines increasing to $V_{PASS}$ after t8. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB). In one embodiment, each unselected word line receives a boosting voltage $V_{PASS}$. In one embodiment, the boosting voltage applied to the unselected word lines depends on their position relative to the selected word line.

The boosting voltage causes the channel potential of unselected NAND strings to increase. In one embodiment, capacitive coupling between the control gate and channel lifts the channel potential. Thus, the pass voltage that is applied to the control gate may serve to boost the channel potential. FIG. 14(C) show the channel potential of the unselected NAND strings increasing to a boosted channel potential 1370 after t8. Because the inhibited NAND string channel is boosted when the program voltage is applied, program disturb of the unselected memory cells at WLn (the selected WL) for the inhibited NAND strings may be reduced or avoided. The boosted channel region voltage decreases the potential across those memory cells' tunnel oxide regions, thus preventing any inadvertent programming.

Thus, program disturb can be prevented on unselected NAND strings. However, FIG. 14(D) shows the channel potential of the selected NAND strings remains at about 0V after t8. Thus, the selected NAND string is enabled for programming.

The program voltage $V_{PGM}$ is then applied to the selected word line at step 1322. FIG. 14(E) show the selected word line being increased from $V_{PASS}$ to $V_{PGM}$ are t9.

At step 1324, the word lines, bit lines, source line, and drain select gate line are lowered to 0V, marking the completion of one programming iteration. This is illustrated after t10 of FIG. 14, in which the various voltages are lowered.

Figure 15:
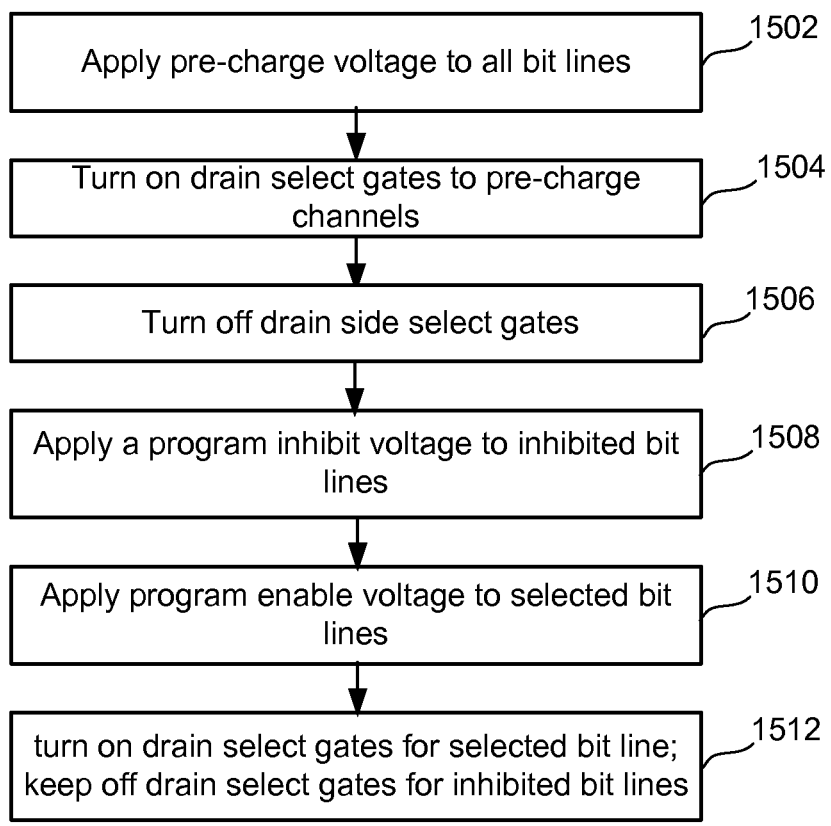
FIG. 15 is a flowchart of one embodiment of a process of programming memory cells.

FIG. 15 is a flowchart of one embodiment of a process of programming memory cells. This process reduces the peak current while programming memory cells. The timing diagrams of FIGS. 14(A)-14(I) will be referred to when discussed this process. However, note that this is to facilitate discussion, and that the process of FIG. 15 is not limited to the timing diagrams of FIG. 14.

In step 1502, a pre-charge voltage is applied to a group of bit lines that include selected and unselected bit lines. For example, referring to FIGS. 14(H) and 14(I), the voltage $V_{DDSA}$ is applied to both selected and unselected bit lines. At this time, the voltage depicted in FIGS. 14(A), 14(B), 14(E), 14(F), and 14(G) may be applied to the respective elements.

In step 1504, the drain side select gates of both selected and unselected NAND strings are turned on. This is represented in FIG. 14(G) showing SGD being raised to $V_{SG}$, which turns on the drain side select gates. As a result, the pre-charge voltage is passed to channels of both selected and unselected bit lines. This is represented in FIGS. 14(C) and 14(D) showing the channels of the selected and unselected NAND strings being charged to voltage 1372. Step 1504 may include applying a voltage to a drain side select line that turns on the drain side select gates of both selected NAND strings and unselected NAND strings while the pre-charge voltage is applied to the group of bit lines.

In step 1506, the drain side select gates of at least the unselected NAND strings are turned off Step 1506 may include applying a voltage to the drain side select line that turns off the drain side select gates of unselected NAND strings. This is represented in FIG. 14(G) showing SGD being lowered to 0V at t5, which turns off the drain side select gates of at least the unselected NAND strings. Note that this occurs after applying the voltage to the drain side select line that turns on the drain side select gates of both selected NAND strings and unselected NAND strings. Optionally, the drain side select gates of selected NAND strings may be turned off in step 1506.

In step 1508, a program inhibit voltage is applied to the inhibited bit lines. In step 1510, a programming enable voltage is applied to the selected bit line. This is depicted in FIG. 14(H). Steps 1508-1510 may include reducing the voltage on the inhibited bit lines from the pre-charge voltage to an inhibit voltage while reducing the voltage on the selected bit lines from the pre-charge voltage to a program enable voltage. This is depicted in FIGS. 14(I) and 14(H). Note that the inhibit voltage may be lower in magnitude than the pre-charge voltage.

Step 1508 may further include cutting off the inhibited NAND strings from the inhibited bit lines while connecting the selected NAND strings to the selected bit lines. This may be achieved by applying a suitable voltage to the drain side select gate line. The pre-charge voltage may be discharged from the channels of selected NAND strings, while maintaining the pre-charge voltage in the channels of unselected NAND strings. This is represented in FIG. 14(D) which shows the channels of the selected NAND strings having their voltage discharged to 0V at time t7. Furthermore, FIG. 14(C) shows the channels of the unselected NAND strings being having their voltage maintained between time t7 and t8.

In step 1512, the drain side select gates of selected bit lines are turned on and the drain side select gates of inhibited bit lines are kept off. This may be achieved by applying suitable voltage to the bit lines and the drain side select gates. Step 1512 may include applying a voltage to the drain side select line to a level that keeps off the drain side select gates associated with the inhibited bit lines while the inhibited bit lines are at the program inhibit voltage and that turns on the drain side select gates that are associated with the selected bit lines while the selected bit lines are at the program enable voltage.

Turning the drain side select gates of selected bit lines on is represented in FIGS. 14(G) and 14(H) which $V_{SGD}$ applied to SGD at t7 and $V_{ENABLE}$ applied to the selected bit lines after t6.

Keeping the drain side select gates of unselected bit lines off is represented in FIGS. 14(G) and 14(I) which $V_{SGD}$ applied to SGD at t7 and $V_{INHIBIT}$ applied to the unselected bit lines after t6. Note the prior to this the drain side select gates of unselected bit lines were off as a result of 0V applied to SGD from t5-t7 (in combination with the bit line and channel voltages).

After step 1512, the channels of unselected NAND strings are boosted from the pre-charge voltage to a boosted potential. This is depicted in FIG. 14(C). This may include applying $V_{PASS}$ to the unselected word lines, as depicted in FIGS. 14(E) and 14(F) at time t8. Many different boosting strategies can be applied. Therefore, it is not required that the same voltage be applied to each of the unselected word lines. Also, a programming voltage is applied to the selected word line with the channels of unselected NAND strings at a boosted potential. This is depicted in FIG. 14(E) at time t9.

The process of FIG. 15 can have additional steps added to it, such as applying a channel pre-charge voltage to unselected word lines. As one example, the voltage $V_{PCE}$ may be applied, as depicted in FIG. 14(F). In one embodiment, the channel pre-charge voltage is applied to unselected word lines between the selected word line and the drain side select line while applying the pre-charge voltage to the group of bit lines. In one embodiment, the channel pre-charge voltage is not applied to unselected word lines between the selected word line and the source side select line.

FIGS. 16(A)-16(I) show timing of various signals during one embodiment of the process of FIG. 13, as well as voltages in the channels of NAND strings. This embodiment is similar to the one depicted in FIGS. 16(A)-16(I) and as such will not be discussed in detail. A difference between the two timing diagrams is that the selected bit line goes from $V_{DDSA}$ at time t6 to $V_{INHIBIT}$. Thus, both the selected and unselected bit lines are reduced simultaneously from $V_{DDSA}$ to $V_{INHIBIT}$. Then, at time t6b, the selected bit line voltage is reduced form $V_{INHIBIT}$ to $V_{ENABLE}$.

Figure 16:
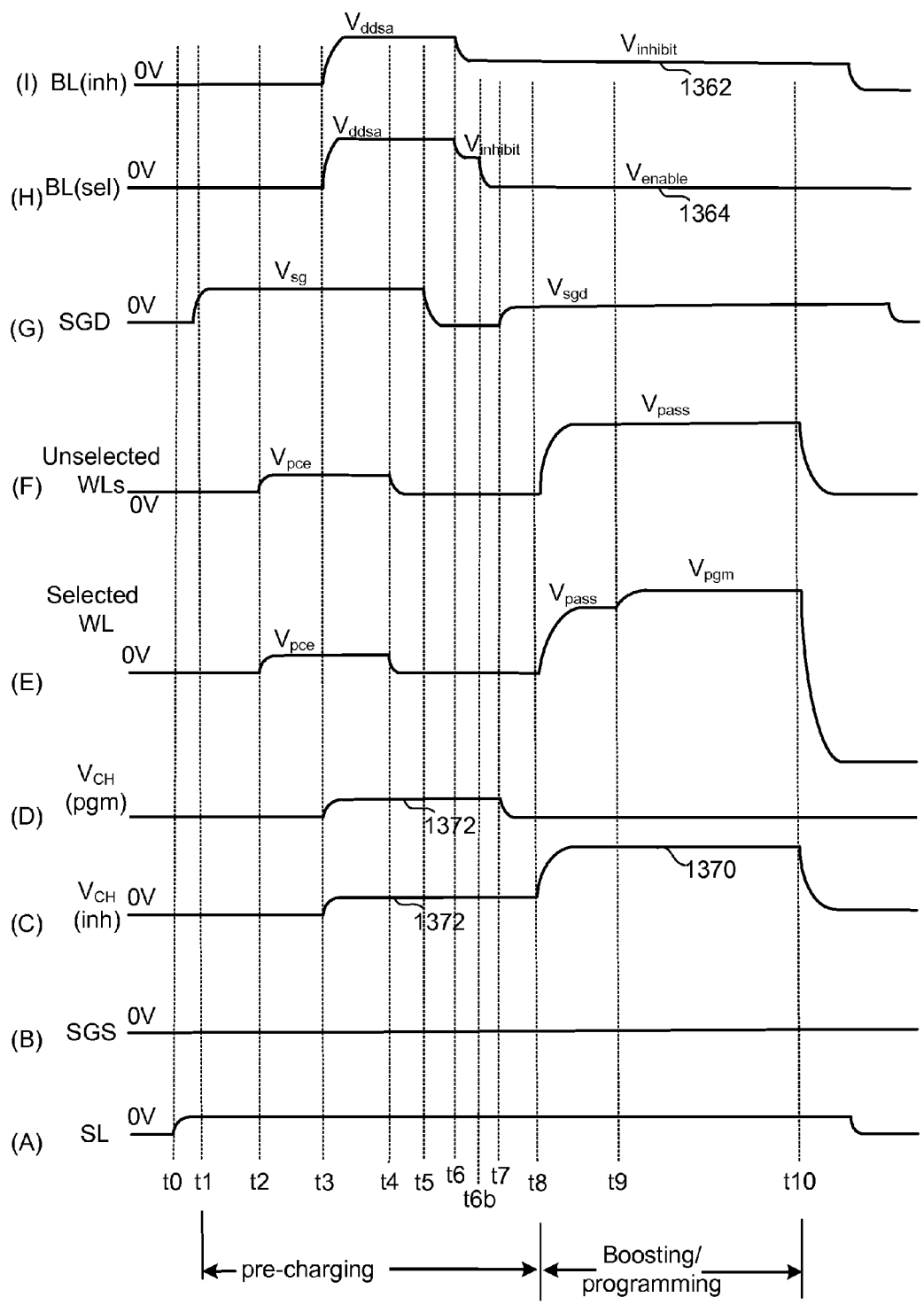
FIGS. 16(A)-16(I) show timing of various signals during one embodiment of the process of FIG. 13, as well as voltages in the channels of NAND strings.

Referring back to FIG. 12, in one embodiment of step 1208 reducing the voltage on the selected bit lines from the pre-charge voltage to the program enable voltage occurs as depicted in FIG. 16(H) from time t6 to t7. Thus, step 1208 does not require that the voltage drop continuously from the pre-charge voltage to the program enable voltage. In one embodiment, the voltage may stop temporarily at an intermediate voltage such as the program inhibit voltage, as shown in FIG. 16(H).

Referring back to FIG. 15, in one embodiment, there may be an additional step of applying the program inhibit voltage to the selected bit lines, as has been discussed with respect to FIG. 16(H).

Additional variations are possible. In one embodiment, a quick pass write (QPW) voltage is applied to bit lines during programming. This may be a third voltage in addition to the program enable voltage $V_{ENABLE}$ and the program inhibit $V_{INHIBIT}$. An example magnitude is 0.7 volts. During the programming phase, the QPW voltage may be passed to the channels of the NAND strings, similar to how $V_{ENABLE\ may}$ be passed to the channels of the selected NAND strings. This may have the effect of slowing down the programming speed as it reduces the voltage difference between the control gate and channel. As one example, QPW may be applied to a bit line associated with a NAND string having a memory cell that is close to its target programming level. The bit lines for which QPW is to be applied during the programming phase may be charged to the pre-charge voltage along with the selected and unselected bit lines during the pre-charging phase.

One embodiment includes a method of operating a non-volatile storage device, which may include the following. A pre-charge voltage is applied to a group of bit lines that include selected bit lines associated with selected NAND strings and inhibited bit lines associated with inhibited NAND strings. The pre-charge voltage is passed to channels of the selected NAND strings and to channels of the inhibited NAND strings. The voltage on the inhibited bit lines is reduced from the pre-charge voltage to a program inhibit voltage. The voltage on the selected bit lines is reduced from the pre-charge voltage to a program enable voltage. The pre-charge voltage is discharged from the channels of the selected NAND strings while maintaining the pre-charge voltage in the channels of the inhibited NAND strings.

One embodiment includes a non-volatile storage device, comprising a plurality of bit lines, a plurality of NAND strings associated with the plurality of bit lines, and managing circuitry in communication with the plurality of bit lines and the plurality of NAND strings. The managing circuitry is configured to apply a pre-charge voltage to selected bit lines and inhibited bit lines of the plurality of bit lines. The managing circuitry is configured to pass the pre-charge voltage to the channels of the selected NAND strings and to the channels of the inhibited NAND strings. The managing circuitry is configured to reduce the voltage on the inhibited bit lines from the pre-charge voltage to a program inhibit voltage. The managing circuitry is configured to reduce the voltage on the selected bit lines from the pre-charge voltage to a program enable voltage. The managing circuitry is configured is configured to discharge the pre-charge voltage from the channels of the selected NAND strings while maintaining the pre-charge voltage in the channels of the inhibited NAND strings.

In one embodiment, the NAND strings in the device of the previous paragraph each comprise a drain side select gate. The device further comprises a drain side select line connected to the drain side select gates. To pass the pre-charge voltage to the channels of the selected NAND strings and to the channels of the inhibited NAND strings, the managing is configured to apply a voltage to the drain side select line that turns on the drain side select gates of both the selected NAND strings and the inhibited NAND strings while the pre-charge voltage is applied to the group of bit lines.

One embodiment includes a method of operating a non-volatile storage device, which may include the following. A pre-charge voltage is applied to a group of bit lines that include selected bit lines and inhibited bit lines. The group of bit lines may be associated with a group of drain side select gates, with each of the bit lines being associated with a NAND string of non-volatile storage element. A voltage is applied to a drain side select line that turns on the drain side select gates of both selected NAND strings and unselected NAND strings while the pre-charge voltage is applied to the group of bit lines. A voltage is applied to the drain side select line that turns off the drain side select gates of unselected NAND strings after applying the voltage to the drain side select line that turns on the drain side select gates of both selected NAND strings and unselected NAND strings. A program inhibit voltage is applied to the inhibited bit lines after applying the voltage to the drain side select line that turns off the drain side select gates of the unselected NAND strings. A program enable voltage is applied to the selected bit lines while applying the program inhibit voltage to the inhibited bit lines. A voltage is applied to the drain side select line to a level that keeps off the drain side select gates associated with the inhibited bit lines while the inhibited bit lines are at the program inhibit voltage and that turns on the drain side select gates that are associated with the selected bit lines while the selected bit lines are at the program enable voltage.

One embodiment includes a 3D non-volatile storage device comprising a substrate, a plurality of word lines layers, a plurality of insulator layers alternating with the word line layers in a stack, a plurality of strings of non-volatile storage elements formed above the substrate in a three-dimensional memory array, a plurality of bit lines associated with the non-volatile storage element strings, a drain side select line coupled to the drain side select gates, and managing circuitry in communication with the plurality of bit lines, the plurality of strings, and the drain side select line. Each of the strings has an active area comprising a channel that extends vertically through the word lines layers and the insulator layers. Each string comprises non-volatile storage elements and a drain side select gate. The managing circuitry applies a pre-charge voltage to selected bit lines and unselected bit lines in the plurality of bit lines. The managing circuitry applies a voltage to the drain side select line that turns on the drain side select gates while the pre-charge voltage is applied to the selected bit lines and the unselected bit lines. The managing circuitry applies a voltage to the drain side select line that turns off the drain side select gates of unselected NAND strings after applying the voltage to the drain side select line that turns on the drain side select gates of both selected NAND strings and unselected NAND strings. The managing circuitry reduces the voltage on the unselected bit lines from the pre-charge voltage to a program inhibit voltage while the managing circuitry reduces the voltage on the selected bit lines from the pre-charge voltage to a program enable voltage. The managing circuitry applies a voltage to the drain side select line to a level that keeps off the drain side select gates associated with the unselected bit lines while the unselected bit lines are at the program inhibit voltage and turns on the drain side select gates that are associated with the selected bit lines while the selected bit lines are at the program enable voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating a non-volatile storage device, the method comprising:
    applying a pre-charge voltage to a group of bit lines that include selected bit lines associated with selected NAND strings and inhibited bit lines associated with inhibited NAND strings;
    passing the pre-charge voltage to channels of the selected NAND strings and to channels of the inhibited NAND strings;
    reducing the voltage on the inhibited bit lines from the pre-charge voltage to a program inhibit voltage;
    reducing the voltage on the selected bit lines from the pre-charge voltage to a program enable voltage; and
    discharging the pre-charge voltage from the channels of the selected NAND strings while maintaining the pre-charge voltage in the channels of the inhibited NAND strings.

2. The method of claim 1, wherein each of the NAND strings have a drain side select gate, the NAND strings are associated with a drain side select line, wherein the passing the pre-charge voltage to channels of the selected NAND strings and to channels of the inhibited NAND strings comprises:
    applying a voltage to the drain side select line that turns on the drain side select gates of both the selected NAND strings and the inhibited NAND strings while the pre-charge voltage is applied to the group of bit lines.

3. The method of claim 2, wherein the discharging the pre-charge voltage from the channels of the selected NAND strings while maintaining the pre-charge voltage in the channels of the inhibited NAND strings comprises:
    applying a voltage to the drain side select line that turns off the drain side select gates of the inhibited NAND strings and that turns on the drain side select gates of the selected NAND strings.

4. The method of claim 1, wherein the passing the pre-charge voltage to channels of the selected NAND strings and to channels of the inhibited NAND strings comprises:
    connecting the selected NAND strings to their respective selected bit lines while connecting the inhibited NAND strings to their respective inhibited bit lines.

5. The method of claim 1, wherein the reducing the voltage on the inhibited bit lines from the pre-charge voltage to a program inhibit voltage and the reducing the voltage on the selected bit lines from the pre-charge voltage to a program enable voltage comprises:

reducing the voltage on the inhibited bit lines from the pre-charge voltage to the program inhibit voltage while reducing the voltage on the selected bit lines from the pre-charge voltage to the program enable voltage.

6. The method of claim 1, further comprising applying a boosting voltage to unselected word lines associated with the NAND strings after maintaining the pre-charge voltage in the channels of the inhibited NAND strings.

7. The method of claim 1, further comprising:
boosting voltages in the channels of the inhibited NAND strings from the pre-charge voltage to a boosted channel voltage; and
applying a programming voltage to a selected word line associated with the selected and unselected NAND strings with the channels of the inhibited NAND strings at the boosted channel voltage.

8. The method of claim 1, wherein the NAND strings are in a 3D memory array.

9. The method of claim 1, wherein the reducing the voltage on the selected bit lines from the pre-charge voltage to a program enable voltage comprises:
reducing the voltage on the selected bit lines from the pre-charge voltage to the program inhibit voltage; and
reducing the voltage on the selected bit lines from the program inhibit voltage to the program enable voltage.

10. A non-volatile storage device, comprising:
a plurality of bit lines;
a plurality of NAND strings associated with the plurality of bit lines, the NAND strings each having a channel; and
managing circuitry in communication with the plurality of bit lines and the plurality of NAND strings, the managing circuitry is configured to apply a pre-charge voltage to selected bit lines associated with selected NAND strings and inhibited bit lines associated with inhibited NAND strings, the managing circuitry is configured to pass the pre-charge voltage to the channels of the selected NAND strings and to the channels of the inhibited NAND strings, the managing circuitry is configured to reduce the voltage on the inhibited bit lines from the pre-charge voltage to a program inhibit voltage, the managing circuitry is configured to reduce the voltage on the selected bit lines from the pre-charge voltage to a program enable voltage, the managing circuitry is configured to discharge the pre-charge voltage from the channels of the selected NAND strings while maintaining the pre-charge voltage in the channels of the inhibited NAND strings.

11. The non-volatile storage device of claim 10, wherein the NAND strings each comprise a drain side select gate, and further comprising a drain side select line connected to the drain side select gates, the managing circuitry being configured to pass the pre-charge voltage to the channels of the selected NAND strings and to the channels of the inhibited NAND strings comprises the managing circuitry being configured to:
apply a voltage to the drain side select line that turns on the drain side select gates of both the selected NAND strings and the inhibited NAND strings while the pre-charge voltage is applied to the selected bit lines and the inhibited bit lines.

12. The non-volatile storage device of claim 11, wherein the managing circuitry being configured to discharge the pre-charge voltage from the channels of the selected NAND strings while maintaining the pre-charge voltage in the channels of the inhibited NAND strings comprises the managing circuitry being configured to:
apply a voltage to the drain side select line that turns off the drain side select gates of the inhibited NAND strings and that turns on the drain side select gates of the selected NAND strings.

13. The non-volatile storage device of claim 10, wherein the managing circuitry being configured to reduce the voltage on the inhibited bit lines from the pre-charge voltage to the program inhibit voltage while reducing the voltage on the selected bit lines from the pre-charge voltage to the program enable voltage comprises the managing circuitry being configured to:
reduce the voltage on the inhibited bit lines from the pre-charge voltage to the program inhibit voltage while reducing the voltage on the selected bit lines from the pre-charge voltage to the program enable voltage, wherein a voltage difference between the program inhibit voltage and the program enable voltage is less than the pre-charge voltage.

14. The non-volatile storage device of claim 10, wherein the NAND strings are in a 3D memory array.

15. The non-volatile storage device of claim 10, wherein the managing circuitry is further configured to:
boost voltages in the channels of the inhibited NAND strings from the pre-charge voltage to a boosted channel voltage and to apply a programming voltage to a selected word line associated with the selected and unselected NAND strings with the channels of the inhibited NAND strings at the boosted channel voltage.

16. The non-volatile storage device of claim 10, wherein the NAND strings comprise memory cells having charge storage trapping layers.

17. The non-volatile storage device of claim 10, wherein the managing circuitry being configured to reduce the voltage on the selected bit lines from the pre-charge voltage to a program enable voltage comprises the managing circuitry being configured to reduce the voltage on the selected bit lines from the pre-charge voltage to the program inhibit voltage while the managing circuitry lowers the voltage on the inhibited bit lines from the pre-charge voltage to the program inhibit voltage, and then reduce the voltage on the selected bit lines from the program inhibit voltage to the program enable voltage.

18. A method of operating a non-volatile storage device, the method comprising:
applying a pre-charge voltage to a group of bit lines that include selected bit lines and inhibited bit lines, the group of bit lines being associated with a group of drain side select gates, each of the bit lines being associated with a NAND string of non-volatile storage elements;
applying a voltage to a drain side select line that turns on the drain side select gates of both selected NAND strings and unselected NAND strings while the pre-charge voltage is applied to the group of bit lines;
applying a voltage to the drain side select line that turns off the drain side select gates of unselected NAND strings after applying the voltage to the drain side select line that turns on the drain side select gates of both selected NAND strings and unselected NAND strings;
applying a program inhibit voltage to the inhibited bit lines after applying the voltage to the drain side select line that turns off the drain side select gates of the unselected NAND strings;
applying a program enable voltage to the selected bit lines while applying the program inhibit voltage to the inhibited bit lines; and
applying a voltage to the drain side select line to a level that keeps off the drain side select gates associated with the inhibited bit lines while the inhibited bit lines are at the program inhibit voltage and that turns on the drain side select gates that are associated with the selected bit lines while the selected bit lines are at the program enable voltage.

19. The method of claim 18, wherein the applying a program inhibit voltage to the inhibited bit lines and the applying a program enable voltage to the selected bit lines comprise:
reducing the voltage on the inhibited bit lines from the pre-charge voltage to the inhibit voltage while reducing the voltage on the selected bit lines from the pre-charge voltage to the program enable voltage.

20. The method of claim 19, further comprising:
applying a boosting voltage to unselected word lines associated with the NAND strings while applying the program inhibit voltage to the inhibited bit lines; and
applying a programming voltage to a selected word line associated with the NAND strings while applying the program enable voltage to the selected bit lines and while applying the boosting voltage to the unselected word lines.

21. The method of claim 18, wherein the NAND strings are in a 3D memory array.

22. A 3D non-volatile storage device comprising:
a substrate;
a plurality of word lines layers;
a plurality of insulator layers alternating with the word line layers in a stack;
a plurality of strings of non-volatile storage elements formed above the substrate in a three-dimensional memory array, each of the strings having an active area comprising a channel that extends vertically through the plurality of word lines layers and the plurality of insulator layers, each string comprising a plurality of non-volatile storage elements and a drain side select gate;
a plurality of bit lines associated with the non-volatile storage element strings;
a drain side select line coupled to the drain side select gates; and
managing circuitry in communication with the plurality of bit lines, the plurality of strings, and the drain side select line, the managing circuitry applies a pre-charge voltage to selected bit lines and unselected bit lines in the plurality of bit lines, the managing circuitry applies a voltage to the drain side select line that turns on the drain side select gates while the pre-charge voltage is applied to the selected bit lines and the unselected bit lines, the managing circuitry applies a voltage to the drain side select line that turns off the drain side select gates of unselected NAND strings after applying the voltage to the drain side select line that turns on the drain side select gates of both selected NAND strings and unselected NAND strings, the managing circuitry reduces the voltage on the unselected bit lines from the pre-charge voltage to a program inhibit voltage while the managing circuitry reduces the voltage on the selected bit lines from the pre-charge voltage to a program enable voltage, the managing circuitry applies a voltage to the drain side select line to a level that keeps off the drain side select gates associated with the unselected bit lines while the unselected bit lines are at the program inhibit voltage and turns on the drain side select gates that are associated with the selected bit lines while the selected bit lines are at the program enable voltage.

23. A non-volatile storage device, comprising:
means for applying a pre-charge voltage to a group of bit lines that include selected bit lines associated with selected NAND strings and inhibited bit lines associated with inhibited NAND strings;
means for passing the pre-charge voltage to channels of the selected NAND strings and to channels of the inhibited NAND strings;
means for reducing the voltage on the inhibited bit lines from the pre-charge voltage to a program inhibit voltage;
means for reducing the voltage on the selected bit lines from the pre-charge voltage to a program enable voltage; and
means for discharging the pre-charge voltage from the channels of the selected NAND strings while maintaining the pre-charge voltage in the channels of the inhibited NAND strings.

* * * * *